United States Patent
Ishii et al.

(10) Patent No.: US 8,949,748 B2
(45) Date of Patent: Feb. 3, 2015

(54) RECORDING MEDIUM RECORDING PROGRAM FOR GENERATING MASK DATA, METHOD FOR MANUFACTURING MASK, AND EXPOSURE METHOD

(75) Inventors: Hiroyuki Ishii, Shioya-gun (JP); Kouichirou Tsujita, Utsunomiya (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 13/280,735

(22) Filed: Oct. 25, 2011

(65) Prior Publication Data

US 2012/0107730 A1    May 3, 2012

(30) Foreign Application Priority Data

Oct. 29, 2010   (JP) .................. 2010-244368

(51) Int. Cl.
```
G06F 17/50        (2006.01)
G03F 1/36         (2012.01)
G03F 7/20         (2006.01)
```
(52) U.S. Cl.
CPC .............. *G03F 1/36* (2013.01); *G03F 7/70125* (2013.01); *G03F 7/70441* (2013.01); *G03F 7/705* (2013.01)
USPC ................... 716/55; 716/50; 716/51; 716/52; 716/53; 716/54; 716/56; 430/5

(58) Field of Classification Search
CPC ............ G03F 7/705; G03F 1/44; G03F 17/50
USPC .......................................... 716/50–56; 430/5
See application file for complete search history.

(56) References Cited

U.S. PATENT DOCUMENTS

| | | | | |
|---|---|---|---|---|
| 5,895,741 | A * | 4/1999 | Hasegawa et al. | 430/5 |
| 6,677,089 | B2 * | 1/2004 | Ogino et al. | 430/30 |
| 7,001,693 | B2 * | 2/2006 | Liebmann et al. | 430/5 |
| 7,147,976 | B2 * | 12/2006 | Liebmann et al. | 430/5 |

(Continued)

FOREIGN PATENT DOCUMENTS

| | | |
|---|---|---|
| CN | 1601697 A | 3/2005 |
| CN | 101013259 A | 8/2007 |

(Continued)

OTHER PUBLICATIONS

Robert Socha et al.; "Simultaneous Source Mask Optimization (SMO);" Photomask and Next-Generation Lithography Mask Technology XLL; Proceedings of SPIE; vol. 5853 (SPIE, Bellingham, WA, 2005); pp. 180-193.

(Continued)

*Primary Examiner* — Helen Rossoshek
(74) *Attorney, Agent, or Firm* — Canon USA, Inc. IP Division

(57) ABSTRACT

A mask includes a main pattern for resolving a target pattern to be formed on a substrate and an auxiliary pattern not resolving. Values of parameters of the main pattern and the auxiliary pattern are set. An image is calculated that is formed when the main pattern and the auxiliary pattern determined by the values of the parameters of the main pattern and the auxiliary pattern are projected by a projection optical system. Based on a result of the calculation that is performed by modifying the values of the parameters of the main pattern and the auxiliary pattern, the values of the parameters of the main pattern and the auxiliary pattern are determined to generate data of the mask including the main pattern and the auxiliary pattern determined.

7 Claims, 20 Drawing Sheets

(56) References Cited

U.S. PATENT DOCUMENTS

| | | | |
|---|---|---|---|
| 7,573,052 B2* | 8/2009 | Inoue et al. | 250/492.22 |
| 7,657,865 B2* | 2/2010 | Yamazoe | 716/54 |
| 7,761,840 B2* | 7/2010 | Yamazoe | 716/54 |
| 8,144,967 B2* | 3/2012 | Kawashima | 382/141 |
| 8,163,448 B2* | 4/2012 | Hakko et al. | 430/30 |
| 8,239,787 B2* | 8/2012 | Yamazoe | 716/54 |
| 8,352,892 B2* | 1/2013 | Hakko et al. | 716/55 |
| 8,365,104 B2* | 1/2013 | Yamazoe | 716/53 |
| 8,365,106 B2* | 1/2013 | Kawashima | 716/54 |
| 8,635,563 B2* | 1/2014 | Yamazoe | 716/53 |
| 2010/0009272 A1* | 1/2010 | Kawashima | 430/5 |
| 2011/0029937 A1* | 2/2011 | Kodera et al. | 716/52 |
| 2011/0032499 A1* | 2/2011 | Kawashima | 355/53 |
| 2011/0065028 A1* | 3/2011 | Kodera et al. | 430/5 |
| 2012/0009509 A1* | 1/2012 | Hakko et al. | 430/5 |
| 2012/0051622 A1* | 3/2012 | Gyoda et al. | 382/144 |
| 2012/0052448 A1* | 3/2012 | Gyoda et al. | 430/322 |
| 2013/0246982 A1* | 9/2013 | Arai | 716/53 |
| 2013/0266893 A1* | 10/2013 | Gyoda | 430/5 |

FOREIGN PATENT DOCUMENTS

| | | |
|---|---|---|
| EP | 2045663 A2 | 4/2009 |
| JP | 2001-358070 A | 12/2001 |
| JP | 2003-318100 A | 11/2003 |
| JP | 2005-026701 A | 1/2005 |
| JP | 2009-093138 A | 4/2009 |
| TW | 200410039 A | 6/2004 |
| TW | 200734828 A | 9/2007 |

OTHER PUBLICATIONS

Daniel S. Abrams et al.; "Fast Inverse Lithography Technology;" Optical Microlithography XIX; Proc. of SPIE; vol. 6154; pp. 61541J-1-61541J-9.

* cited by examiner

RECORDING MEDIUM RECORDING PROGRAM FOR GENERATING MASK DATA, METHOD FOR MANUFACTURING MASK, AND EXPOSURE METHOD

BACKGROUND OF THE INVENTION

1. Field of the Invention

The present invention relates to a recording medium on which a program for generating mask data is recorded, a method for manufacturing a mask, and an exposure method.

2. Description of the Related Art

Exposure apparatuses are used in processes for manufacturing integrated circuits (ICs), large scale integrated circuits (LSIs), and other semiconductor devices. Exposure apparatuses illuminate a mask (reticle) with an illumination device, and project an image of a pattern drawn on the mask onto a substrate (wafer) using a projection optical system for substrate exposure.

Among techniques for improving the resolution performance of an exposure apparatus is super-resolution technology. According to the technology, for example, an auxiliary pattern that itself resolves no image is formed on a mask. Such a mask is then used to resolve a pattern to be formed on a substrate. Methods available for designing the layout of an auxiliary pattern include one using an interference map (Robert Socha, et al., "Simultaneous Source Mask Optimization (SMO)," Proc. SPIE 5853, 180-193 (2005)), one using inverse lithography (Daniel S. Abrams, et al., "Fast Inverse Lithography Technology," Proc. SPIE 6154, 61541) (2006)), and one discussed in Japanese Patent Application Laid-Open No. 2009-093138.

According to Robert Socha, et al., "Simultaneous Source Mask Optimization (SMO)," Proc. SPIE 5853, 180-193 (2005), the shape of a main pattern to be transferred to a substrate and the shape of an auxiliary pattern are separately determined in the pattern shape optimization. Since both the shapes can affect the projection image projected on the substrate, the separately-determining method tends to be trapped in a local minimum (local solution) and is less likely to reach an optimum shape (optimum solution) of the mask pattern. There has also been an issue that the amount of calculations needed to determine an optimum solution increases.

The method discussed in Japanese Patent Application Laid-Open No. 2009-093138 determines a mask pattern by deforming a main pattern and an auxiliary pattern. The method uses an approximate aerial image, not a strict image that is calculated based faithfully on physical models. Since the mask pattern is determined based only on its approximate aerial image, there is a possibility of causing errors in the result of optimization. Approximate aerial images may exhibit a complicated pattern, which can complicate the mask pattern in shape.

The inverse lithograph discussed in Daniel S. Abrams, et al., "Fast Inverse Lithography Technology," Proc. SPIE 6154, 61541J (2006), determines a main pattern and an auxiliary pattern at a time. The inverse lithography, however, has the drawbacks that the resulting mask pattern is complicated since the mask pattern is generated from a two-dimensional map that has a complicated pattern of continuous intensities. Hence the mask manufacturing cost is high.

SUMMARY OF THE INVENTION

According to an aspect of the present invention, a recording medium stores a program for causing a computer to generate data of a mask used in an exposure apparatus that exposes a substrate using a projection optical system for projecting an image of a pattern of the mask onto the substrate, wherein the mask includes a main pattern for resolving a target pattern to be formed on the substrate and an auxiliary pattern, and the program causes the computer to execute steps of setting a main value of a parameter of the main pattern and a auxiliary value of a parameter of the auxiliary pattern, calculating an image that is formed if the main pattern and the auxiliary pattern, determined by the set main and auxiliary values respectively, are projected by using the projection optical system, and determining the main value and the auxiliary value based on a result of calculation that is executed by modifying the main value and the auxiliary value, and generating data of the mask including the determined main pattern and auxiliary pattern.

According to another aspect of the present invention, a recording medium stores a program for causing a computer to determine data of a mask and an exposure condition used in an exposure apparatus that exposes a substrate using a projection optical system for projecting an image of a pattern of the mask onto the substrate, wherein the mask includes a main pattern for resolving a target pattern to be formed on the substrate and an auxiliary pattern, and the program causes the computer to execute steps of setting a main value of a parameter of the main pattern and a auxiliary value of a parameter of the auxiliary pattern, setting a light intensity value of a parameter of a light intensity distribution on a pupil plane of an illumination optical system for illuminating the mask, calculating an image that is formed if the main pattern and the auxiliary pattern, determined by the set main auxiliary values respectively, are projected by using the projection optical system under the set light intensity, and determining the main value, the auxiliary value, and the light intensity value on a result of the calculation that is executed by modifying the main value, the auxiliary value, and the light intensity value.

Further features and aspects of the present invention will become apparent from the following detailed description of exemplary embodiments with reference to the attached drawings.

BRIEF DESCRIPTION OF THE DRAWINGS

The accompanying drawings, which are incorporated in and constitute a part of the specification, illustrate exemplary embodiments, features, and aspects of the invention and, together with the description, serve to explain the principles of the invention.

DESCRIPTION OF THE EMBODIMENTS

Various exemplary embodiments, features, and aspects of the invention will be described in detail below with reference to the drawings.

Figure 1:
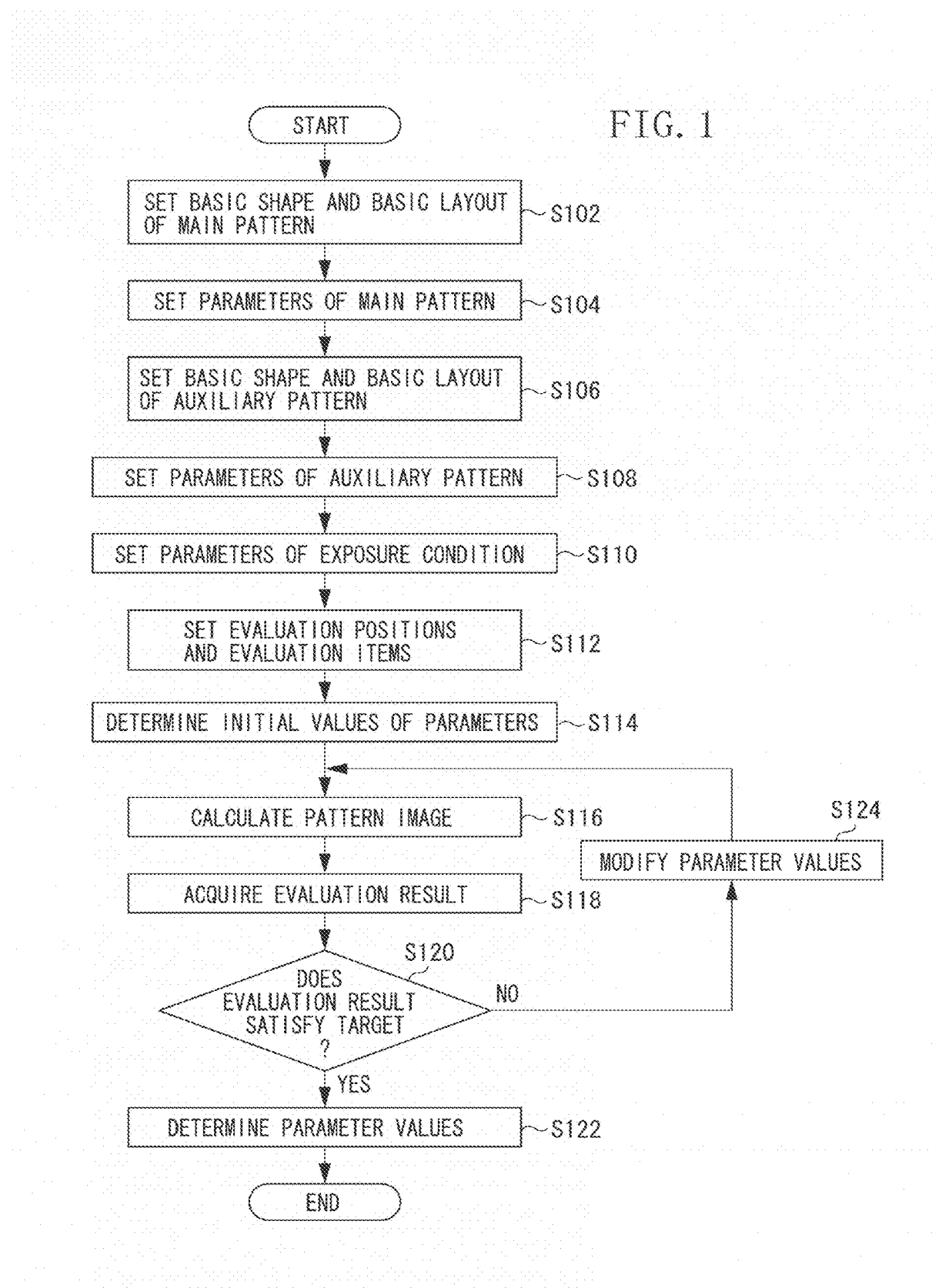
FIG. 1 is a flowchart illustrating a determination method according to a first exemplary embodiment.

FIG. 1 is a flowchart for determining a mask pattern. A mask pattern is determined by installing a program for performing the steps in a computer and causing the computer to execute the program.

In a first exemplary embodiment, a mask includes a main pattern to be transferred to a substrate and an auxiliary pattern (also referred to as sub-resolution assist features (SRAF)) not to be transferred to the substrate. The shapes and positions of both the patterns are to be determined. An exposure condition is also determined that is used in projecting an image of the mask pattern including both the main pattern and the auxiliary pattern onto a wafer (substrate) for wafer exposure.

The method for determining the mask pattern and the exposure condition according to the present exemplary embodiment will be described with reference to FIG. 1. In step S102, the computer sets a basic shape and a basic layout of the main pattern are set. For example, the basic shape may be a rectangular or square shape, and the basic layout may be bilaterally symmetrical. In step S104, the computer sets parameters for determining the shape and the position of the main pattern.

In step S106, the computer sets a basic shape and a basic layout of the auxiliary pattern. In step S108, the computer sets parameters for determining the shape and the position of the auxiliary pattern. In step S110, the computer sets parameters that describe an exposure condition for projecting an image of the mask pattern onto a wafer for exposure.

In step S112, the computer sets positions and evaluation items for evaluating the image of the pattern projected on the wafer. To make such settings, a user may input data and the computer may set the input data. Alternatively, the computer may automatically perform the settings by executing a code that is implemented in the program.

In step S114, the computer determines initial values of the parameters set in steps S104, S108, and S110. In step S116, using the patterns and the exposure condition expressed by the initial values determined in step S114, the computer calculates a pattern image that is projected on the wafer when the patterns are arranged on an object plane and projected by using a projection optical system under the exposure condition. For image calculation, the computer may use known calculation methods such as Abbe's theory of imaging and a method using a transmission cross coefficient (TCC). In step S118, the computer evaluates the pattern image calculated in step S116 to acquire an evaluation result.

In step S120, the computer compares the evaluation result acquired in step S118 with a target to determine whether the evaluation result satisfies the target. If the evaluation result is determined to satisfy the target (YES in step S120), then in step S122, the computer outputs the values of the respective parameters determined in step S114 as final values. The computer then ends the work flow. If the evaluation result is determined not to satisfy the target (NO in step S120), then in step S124, the computer modifies the values of at least one of the parameters of the main pattern, the auxiliary pattern, and the exposure condition. Having thus determined the values of the parameters again, the computer performs the processing in steps S116, S118, and S120 again.

The computer repeats the processing in steps S116, S118, S120, and S124 until the evaluation result of the image satisfies the target. In step S120, if the evaluation result is determined to satisfy the target (YES in step S120), then in step S122, the computer determines the values of the parameters determined in step S124 as final values and generates mask data.

The data pieces on the mask pattern and the exposure condition determined by the values of the respective parameters may be stored in a storage device. The data may be displayed on a display device as calculation results. In the repeat loop of steps S116, S118, S120, and S124, the values of the parameters of the main pattern, the auxiliary pattern, and the exposure condition are modified, and pattern image calculation and evaluation is performed.

Next, description will be given in conjunction with specific examples. Initially, preconditions will be described. The exposure light is an argon fluoride (ArF) excimer laser. The projection optical system has a numerical aperture (NA) of 1.35. An immersion exposure apparatus is assumed that performs exposure with a liquid filled between the projection optical system and a wafer. The mask is a binary mask. A positive resist is applied to the wafer. In the present exemplary embodiment, the projection optical system has a projection magnification of ¼ times. For the sake of convenience, coordinates on the mask pattern will be expressed in terms of coordinates on an image plane, i.e., in values multiplied by the projection magnification.

Figure 2:
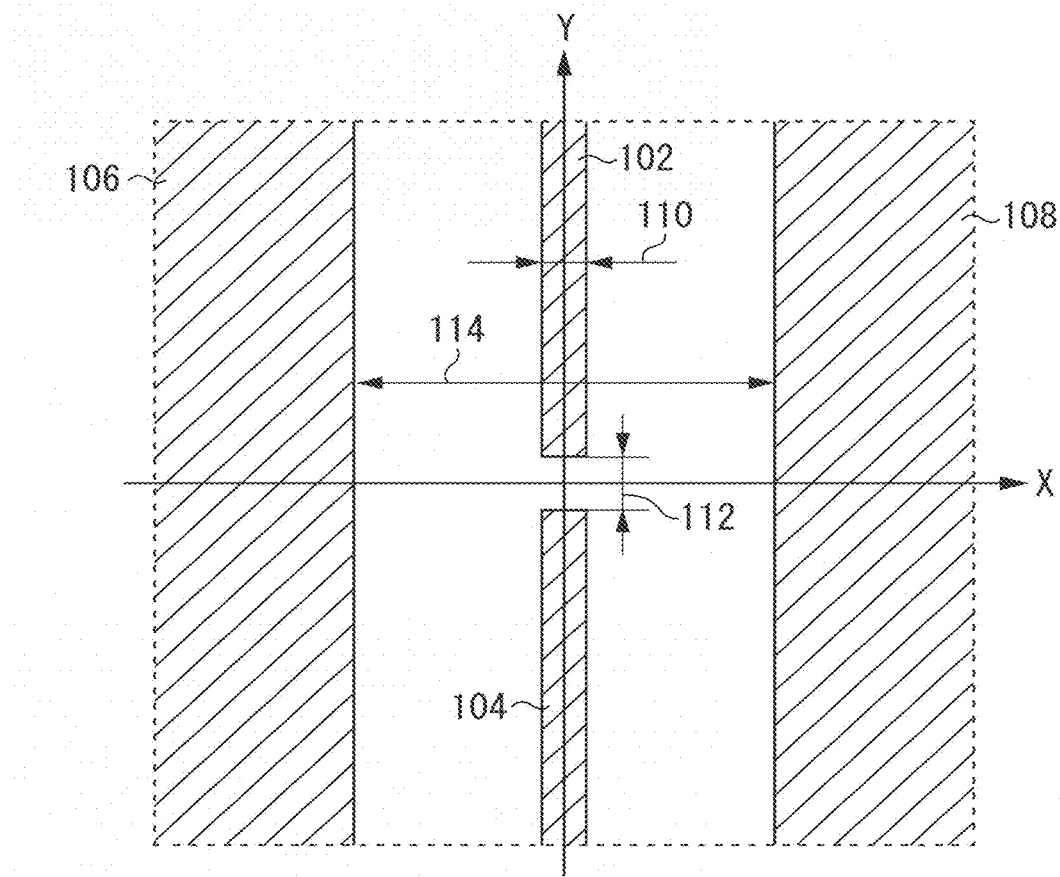
FIG. 2 illustrates a target pattern according to the first exemplary embodiment.

FIG. 2 is an enlarged view of a center part of the shape of a target pattern to be formed on a wafer. The hatched portions represent areas not to be exposed. The white portions represent areas to be exposed. The target pattern is vertically and horizontally symmetrical. The axis of vertical symmetry will be referred to as an x-axis, and the axis of horizontal symmetry a y-axis. Line patterns 102 and 104 have a width 110 of 70 nm. A distance 112 between the line ends is 100 nm. The line patterns 102 and 104 have a sufficient large length. Patterns 106 and 108 are large patterns arranged in the vicinity of the line patterns, with sufficiently large dimensions both in the horizontal and vertical directions. The large patterns 106 and 108 have an interval 114 of 670 nm therebetween.

The light intensity distribution (effective light source distribution) on the pupil plane of an optical system for illuminating the mask (illumination optical system) has an annular shape. The annular illumination will be described in detail below. Aberrations of the projection optical system are negligible.

Figure 3:
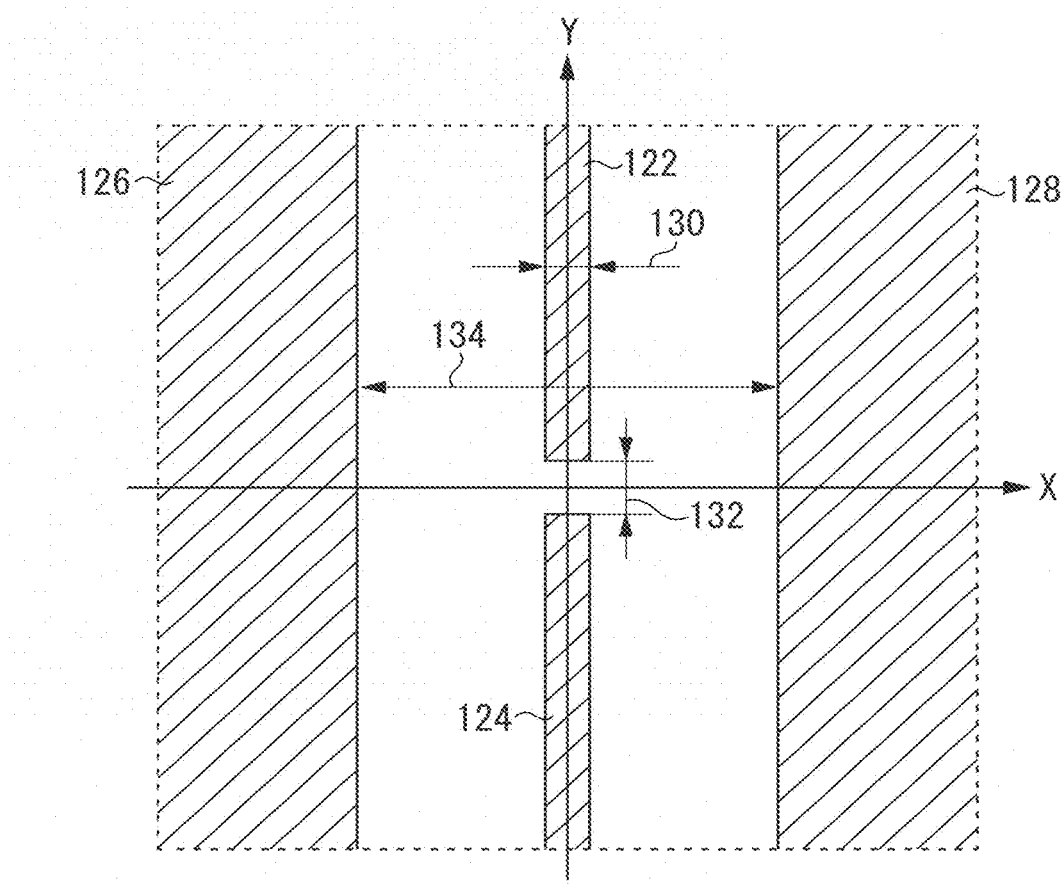
FIG. 3 illustrates the basic shape, basic layout, and parameters of a main pattern according to the first exemplary embodiment.

FIG. 3 illustrates the basic shape and basic layout of the main pattern and the parameters for determining the shape and position of the main pattern which are set in steps S102 and S104 of the flowchart in FIG. 1. FIGS. 122, 124, 126, and 128 constitute the main pattern. The main pattern has a basic shape of rectangular configuration with sides in parallel with the x- and y-axes. Since the target pattern is vertically and horizontally symmetrical and the effective light source distribution is symmetrical, the basic layout of the main pattern is also set to be vertically and horizontally symmetrical.

A parameter 130 indicates a line width of the line patterns 122 and 124 on the mask. A parameter 132 indicates an interval between the line patterns 122 and 124 on the mask. A parameter 134 indicates an interval between the large patterns 126 and 128. The shape and position of the main pattern are uniquely determined from the pattern symmetry described above if the values of these three parameters 130, 132, and 134 are determined. These three parameters 130, 132, and 134 are therefore set for the main pattern.

Figure 4:
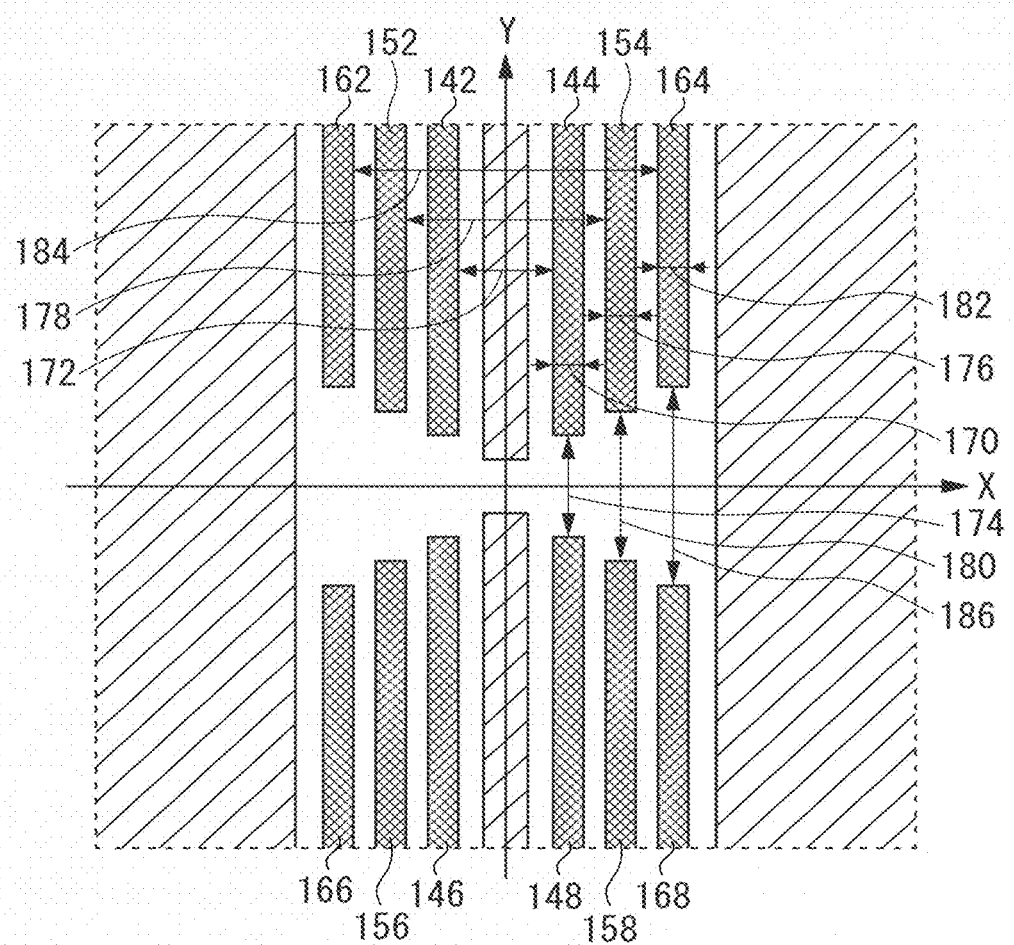
FIG. 4 illustrates the basic shape, basic layout, and parameters of an auxiliary pattern according to the first exemplary embodiment.

FIG. 4 illustrates the basic shape and basic layout of the auxiliary pattern and the parameters for determining the shape and position of the auxiliary pattern which are set in steps S106 and S108 of the flowchart. FIGS. 142, 144, 146, 148, 152, 154, 156, 158, 162, 164, 166, and 168 constitute the auxiliary pattern. The auxiliary pattern has a basic shape of rectangular configuration with sides in parallel with the x- and y-axes. Since the target pattern is vertically and horizontally symmetrical and the effective light source distribution is symmetrical, the basic layout of the auxiliary pattern is also set to be vertically and horizontally symmetrical.

A parameter 170 indicates a width of first auxiliary patterns 142 to 148, which are positioned innermost, on the mask. A parameter 172 indicates an interval between the first auxiliary patterns in the X direction. A parameter 174 indicates an interval between the first auxiliary patterns in the Y direction. The shape and position of the first auxiliary patterns are uniquely determined from the pattern symmetry if the values of these three parameters 170, 172, and 174 are determined. Similarly, the shape and position of second auxiliary patterns 152 to 158 are uniquely determined if values of three parameters including a width 176, an interval 178 in the X direction, and an interval 180 in the Y direction are determined. Similarly, the shape and position of third auxiliary patterns 162 to 168 are uniquely determined if values of three parameters including a width 182, an interval 184 in the X direction, and an interval 186 in the Y direction are determined. In this way, the nine parameters 170 to 186 are set for the auxiliary pattern.

While the foregoing main pattern and auxiliary pattern are set to have a basic shape of rectangular configuration, the basic shapes are not limited to a rectangle. For example, line patterns may have a hammer-headed end. In such a case, the size of the hammer head may be set as a pattern parameter. A single pattern may be expressed by a combination of a plurality of polygonal shapes. The foregoing settings of the parameters of the main pattern and the auxiliary pattern are just an example. Other settings may be used as far as the patterns are uniquely determined. With a rectangular basic shape, the center coordinates of the rectangle and the widths in both X and Y directions may be used as parameters. The coordinates of pattern vertexes may be used.

Figure 5:
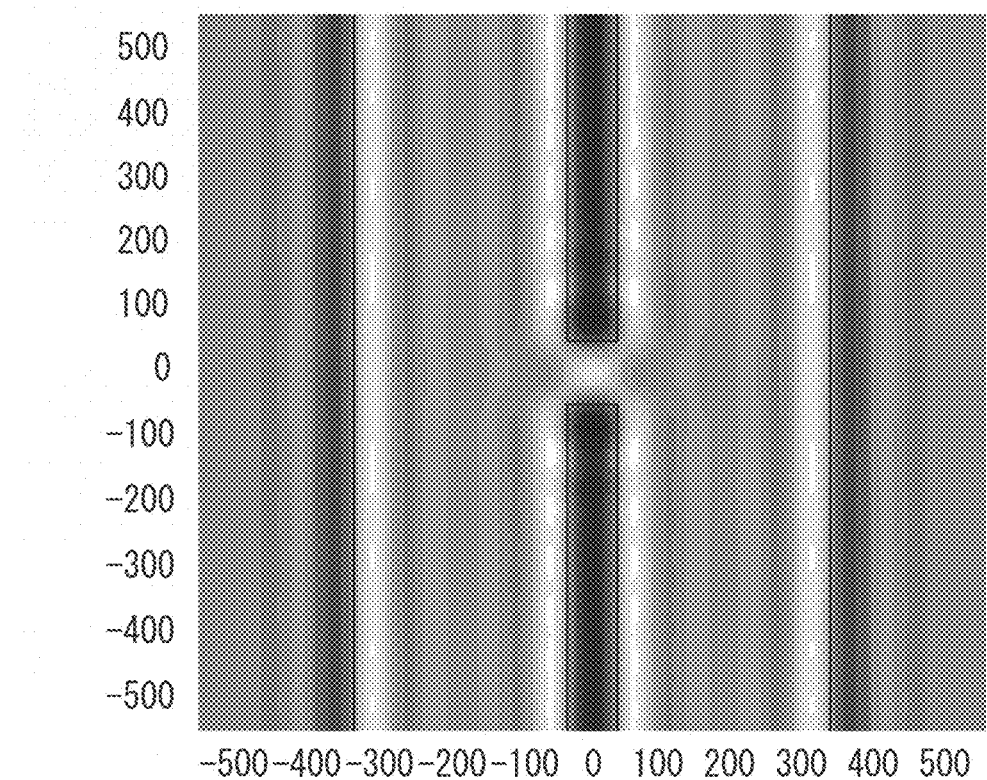
FIG. 5 illustrates a second-order differential of an approximate aerial image according to the first exemplary embodiment.

In the present exemplary embodiment, the basic shape and basic layout of the auxiliary pattern are determined by reference to Japanese Patent Application Laid-Open No. 2009-093138. FIG. 5 illustrates the second-order differential (Laplacian) of an approximate aerial image discussed in Japanese Patent Application Laid-Open No. 2009-093138, superposed on a target pattern (in solid lines). Relatively dim portions other than the portions of the target pattern are locations suited for an auxiliary pattern.

While the basic shape and basic layout of the auxiliary pattern in the present exemplary embodiment are determined by reference to the method discussed in Japanese Patent Application Laid-Open No. 2009-093138, the determination method is not limited thereto. For example, the basic shape and basic layout of the auxiliary pattern may be determined by reference to an interference map discussed in Robert Socha, et al., "Simultaneous Source Mask Optimization (SMO)," Proc. SPIE 5853, 180-193 (2005). The basic shape and basic layout of the auxiliary pattern may be determined by reference to a result of inverse lithography discussed in Daniel S. Abrams, et al., "Fast Inverse Lithography Technology," Proc. SPIE 6154, 61541J (2006). The determination of the detailed shape of the auxiliary pattern will be described below.

Figure 6:
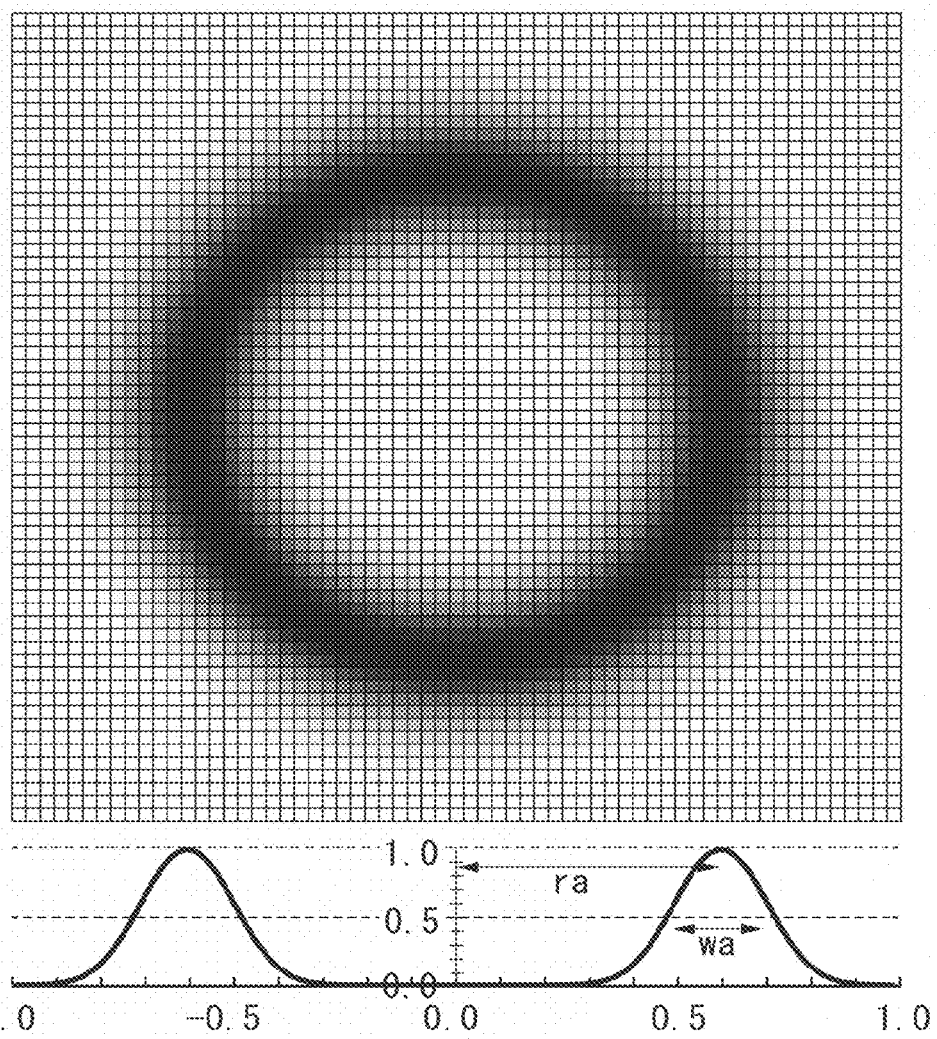
FIG. 6 illustrates a setting of parameters of an effective light source distribution according to the first exemplary embodiment.

Next, in step S110 of the flowchart, the computer sets parameters of the exposure condition. For the exposure condition, the present exemplary embodiment deals with an effective light source distribution. FIG. 6 illustrates an effective light source distribution and parameter settings. The upper part of FIG. 6 is a two-dimensional map illustrating the effective light source distribution. The lower part of FIG. 6 is a sectional view taken along the x-axis. The effective light source distribution in the upper part shows the magnitude of light intensity by the strength of black. In the diagram, a parameter ra is related to a radius of the annular bright portion, and a parameter wa is related to a width of the annular shape.

More specifically, the light intensity distribution I is expressed as the following formula 1.

$$I = \exp\left(-\frac{2(r-r_a)^2}{w_a^2}\right) \quad (1)$$

Here, r is a distance from the center of the effective light source. ra and wa are set as parameters for expressing the effective light source distribution. In the present exemplary embodiment, the effective light source distribution is defined by using a function that varies smoothly. This is not restrictive, however. For example, assuming an effective light source distribution of top hat shape, an outer σ value and an inner σ value may be set. The σ values are coherent factors. The distribution of polarized light in the effective light source distribution may also be set as a parameter.

While the present exemplary embodiment deals with the effective light source distribution as the exposure condition, the exposure condition may also include the NA of the projection optical system, pupil functions typified by aberrations of the projection optical system, a spectral distribution of exposure wavelengths, and the range of defocus in multiple defocused exposure. Zernike coefficients of wave-front aberration may be set as parameters for the aberrations of the projection optical system. As described above, various types of exposure conditions may be set as parameters.

Figure 7:
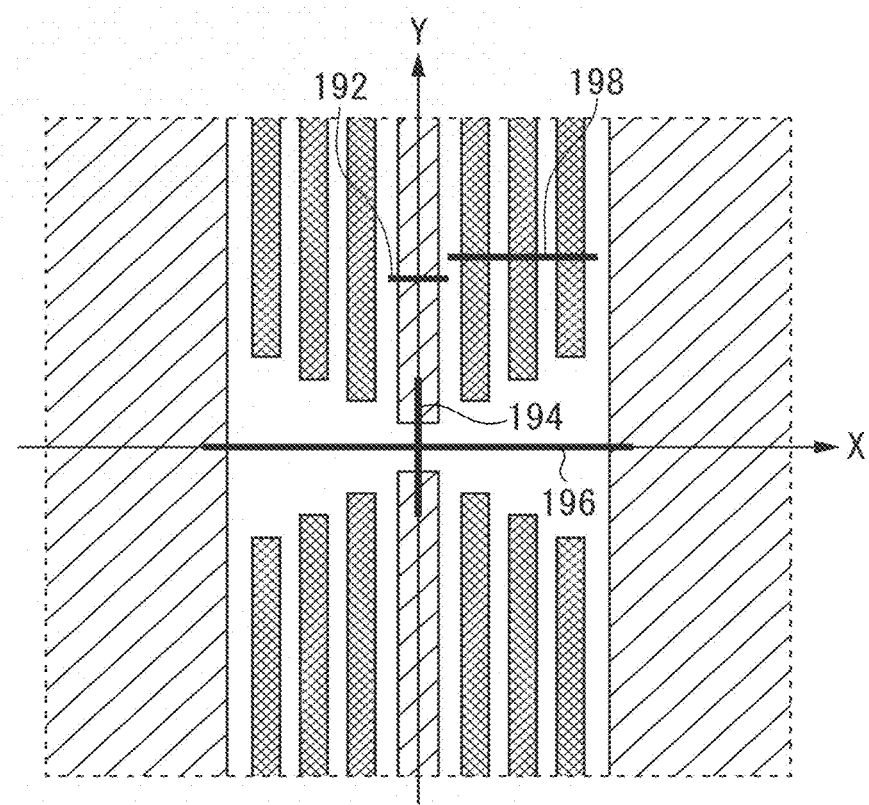
FIG. 7 illustrates a setting of evaluation positions on a pattern image according to the first exemplary embodiment.

FIG. 7 illustrates a setting of evaluation positions in step S112 of the flowchart in FIG. 1. Positions 192, 194, 196, and 198 in thick lines are where to evaluate the pattern image. An evaluation item in the position 192 is the width of the image of the line pattern 122. Another evaluation item in the position 192 is an image log slope (ILS). In the position 194, the interval between the images of the line patterns 122 and 124 in the Y direction is evaluated. In the position 194, an ILS is also evaluated. In the position 196, the interval between the images of the large patterns 126 and 128 is evaluated. The position 198 is located across the auxiliary patterns. Since the auxiliary pattern is not to be transferred to the substrate, the presence or absence of an image here is evaluated.

In the present exemplary embodiment, the shape of the target pattern, the shape of the pattern on the object plane, and the effective light source distribution are vertically and horizontally symmetrical. Further, the aberrations of the projection optical system are negligible, the formed image is also vertically and horizontally symmetrical. The evaluation positions are set in consideration of such symmetries. The evaluation position for evaluating the width of the line pattern is not limited to the position 192, for example. The evaluation position may be moved in parallel in the Y direction if needed. A plurality of such evaluation positions may be set. While the present exemplary embodiment deals with the case where the image width and the ILS are set as evaluation items, various other items may be used including an image position, the depth of focus, a dose sensitivity, a process window, a normalized image log slope (NILS), image contrast, a mask error enhancement factor (MEEF), and electrical characteristics.

In step S114, the computer sets initial values of the parameters 130 to 134, 170 to 186, ra, and wa. The initial values may be set by various methods. For example, upper and lower limits may be set for each parameter, and determined by random numbers. How to determine the initial values of the parameters is concerned with optimization techniques, which are not a principle subject of the present invention. Detailed description thereof will thus be omitted.

In step S116, the computer acquires a pattern image. The computer calculates the pattern image by simulation, using the preconditions such as the wavelength and NA as well as the patterns and the effective light source distribution which are determined by the parameter values set in step S114. While the present exemplary embodiment deals with the case of determining an aerial image as the pattern image, a resist image or even an etching image resulting from etching may be used.

Figure 8:
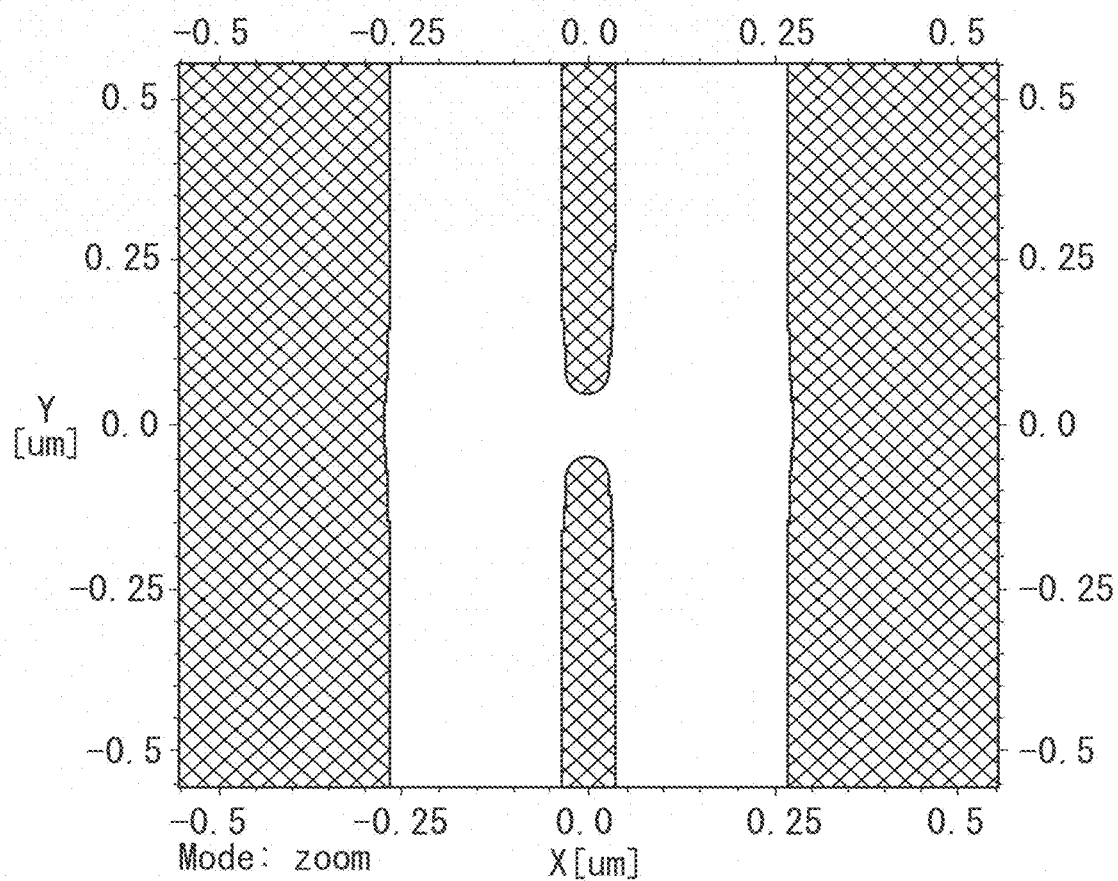
FIG. 8 illustrates an example of a pattern image according to the first exemplary embodiment.

FIG. 8 is a contour map illustrating an example of a pattern image. In the present exemplary embodiment, all the evaluation items set in step S112 are in a non-defocused state. The acquired image is thus a non-defocused image. A defocused image may also be acquired, for example, when evaluating the depth of focus. Generally speaking, images that are needed in view of the preconditions and evaluation items shall be acquired.

In step S118, the computer acquires an evaluation result. The computer evaluates the image acquired in step S116 for the evaluation items set in step S112 at the evaluation positions set in step S112.

In step S120, the computer determines whether the evaluation items satisfy the respective target. The target employed in the present exemplary embodiment is such that the width 192 of the line pattern is as close to 70 nm as possible, the interval 194 between the line patterns in the Y direction is as close to 100 nm as possible, and the interval 196 between the large patterns is as close to 670 nm as possible. Alternatively, the target may be set in terms of values or ranges like "70±2 nm." The target in the evaluation position 198 is that there is no image formed.

The target ILS values in the evaluation positions 192 and 194 may be such that the smaller one of the ILS values in the evaluation positions 192 and 194 is as large as possible. The target of "being as large as possible," however, makes the determination in step S120 always NO. To avoid this, the computer may previously determine the maximum number of times of determination. In step S120, the computer may determine whether the maximum number of times is reached, instead of whether the target is satisfied, and give a YES if the maximum number of times is reached.

If NO in step S120, then in step S124, the computer modifies the values of at least one of the parameters of the main pattern, the auxiliary pattern, and the exposure condition to determine the values of the parameters again. For example, the values of the parameters may be determined by using random numbers. Values that are considered to produce a better result may be employed based on previous calculations. How to determine the parameter values again is concerned with optimization techniques, which are not a principle subject of the present invention. Detailed description thereof will thus be omitted. Having determined the parameter values again, the computer repeats the processing in steps S116, S118, and S120. If YES in S120, then in step S122, the computer determines those values of the respective parameters as the final values of the parameters. The computer outputs the final values of the parameters to the storage device or the display device as calculation results.

If it is determined YES in step S120 when the number of determinations reaches the maximum number of times, the computer determines the values of the parameters that provide highest image performance among evaluation results made so far, as the final values of the parameters.

Figure 9:
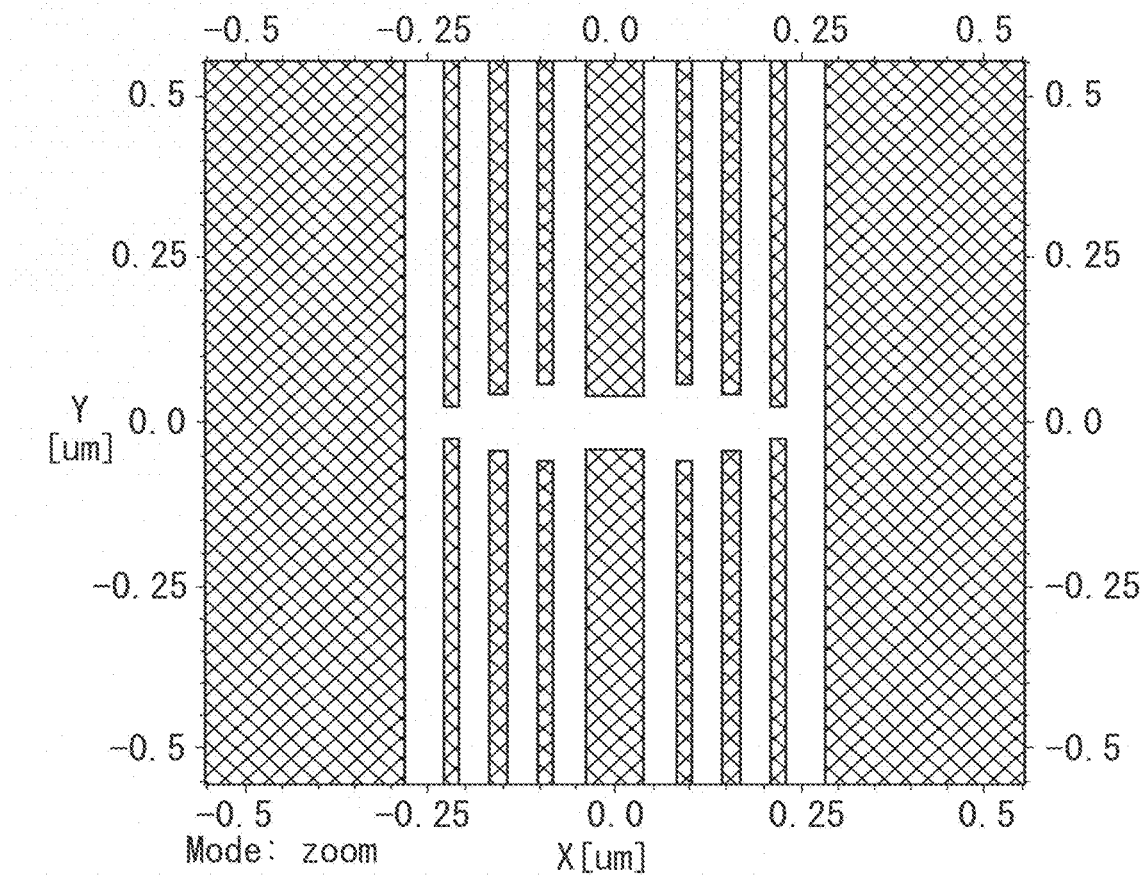
FIG. 9 illustrates a mask pattern that is determined in the first exemplary embodiment.
Figure 10:
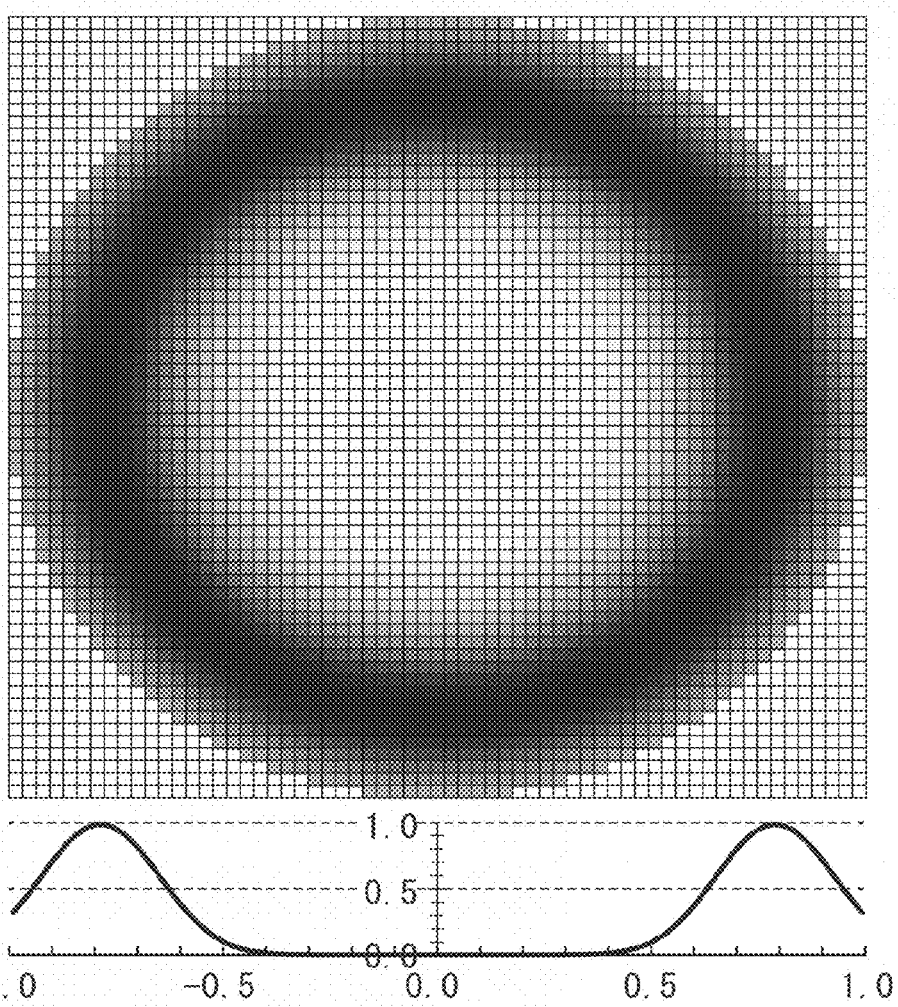
FIG. 10 illustrates an effective light source distribution that is determined in the first exemplary embodiment.

FIG. 9 illustrates a mask pattern that is determined by the final values of the parameters determined in step S122. FIG. 10 illustrates an effective light source distribution that is drawing based on the parameters ra and wa determined in step S122. The effective light source distribution in the upper part in FIG. 10 shows the magnitude of light intensity by the strength of black. The lower part in FIG. 10 shows the light intensity distribution in a cross section. Given the pattern image illustrated in FIG. 8, the evaluation results were as follows: The width 192 of the line pattern was 70.0 nm. The interval 194 between the line patterns in the Y direction was 100.0 nm. The interval 196 between the large patterns was 670.0 nm. The results were sufficiently close to the targets. Further, no image of the auxiliary pattern was formed in the evaluation position 198. The ILS values in the evaluation positions 192 and 194 were 25.1 and 26.4, respectively.

As described above, according to the present exemplary embodiment, the image performance of the pattern including the main pattern and the auxiliary pattern is evaluated while modifying the values of the parameters of the main pattern, the auxiliary pattern, and the exposure condition. Accordingly, the present exemplary embodiment can acquire a mask pattern and an exposure condition which have a high resolution performance and can provide an image highly similar to a target pattern. Further, in the present exemplary embodiment, a simple basic shape and a simple basic layout of the mask pattern are determined in advance and parameters are optimized based on the simple basic shape and simple basic layout. This results in a simple mask pattern, which can suppress the mask manufacturing cost as compare to the conventional techniques.

A suitable example of application of the present exemplary embodiment is application to memory cells. Memory cells desirably have as small size as possible. The optimization of the exposure condition as well as the mask pattern is thus highly advantageous.

Another suitable example of application of the present exemplary embodiment is application to a standard cell library. A standard cell library refers to a collection of a plurality of prefabricated single cell patterns having limited functionality, such as an AND circuit and a NAND circuit. A standard cell library is used primarily for designing logic devices. After logic design, a pattern on a mask is generated by referring to a standard cell library. An exposure condition, typified by an effective light source distribution, can be optimized simultaneously with the generation of patterns included in a standard cell library.

The simultaneous optimization of a mask pattern and an exposure condition can also be achieved by inverse lithography. Inverse lithography, however, has the drawback that the resulting mask pattern is complicated and the mask manufacturing cost is high since the mask pattern is generated from a two-dimensional map that has a complicated pattern of continuously changing values.

The present exemplary embodiment has dealt with the case of determining a single mask pattern. However, this is not restrictive, and a plurality of mask patterns may be determined at a time. More specifically, mask patterns and exposure conditions may be simultaneously determined of all or part of patterns that are included in a standard cell library.

Figure 11:
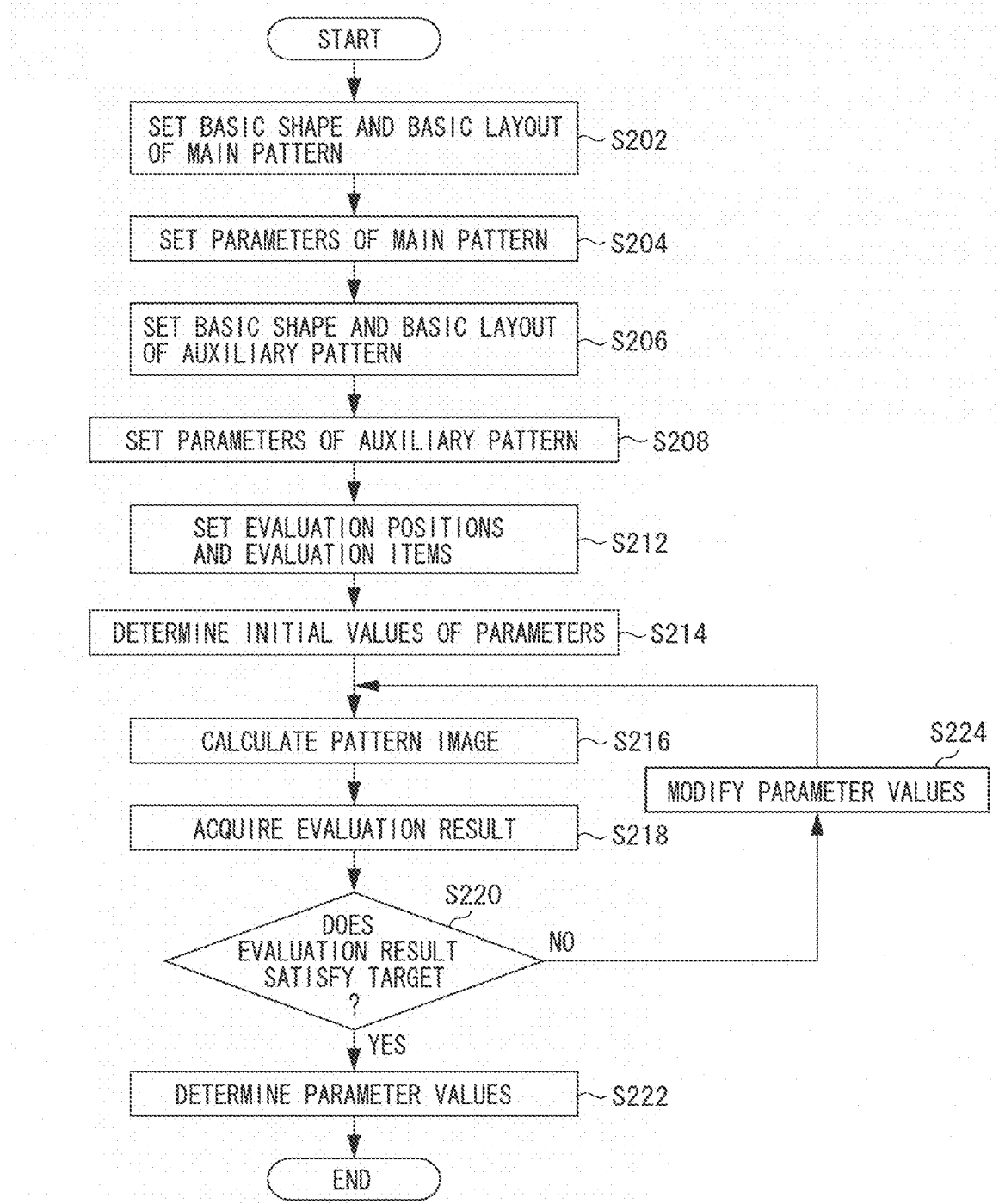
FIG. 11 is a flowchart illustrating a method for determining a mask pattern according to a second exemplary embodiment.

Next, a method of determining a mask pattern according to a second exemplary embodiment will be described with reference to FIG. 11. FIG. 11 is a flowchart for determining a mask pattern according to the second exemplary embodiment. In the present exemplary embodiment, a mask pattern includes a main pattern to be transferred to a substrate and an auxiliary pattern not to be transferred. Shapes and positions of both the patterns are to be determined. It should be noted that the exposure condition is determined in advance and will not be changed.

The method for determining a mask pattern according to the present exemplary embodiment will be described with reference to FIG. 11. In step S202, the computer initially determines a basic shape and a basic layout of a main pattern on a mask. In step S204, the computer sets parameters for determining the shape and the position of the main pattern on the mask. In step S206, the computer sets a basic shape and a basic layout of an auxiliary pattern on the mask.

In step S208, the computer sets parameters for determining the shape and the position of the auxiliary pattern on the mask. In step S212, the computer sets evaluation positions and evaluation items for a pattern image to be formed on a wafer. In step S214, the computer determines initial values of the parameters set in steps S204 and S208.

In step S216, the computer acquires a pattern image that is formed on the wafer (image plane) when the patterns that are determined by the initial values determined in step S214 are illuminated. In step S218, the computer evaluates the pattern image acquired in step S216 to acquire an evaluation result.

In step S220, the computer compares the evaluation result acquired in step S218 with a target to determine whether the evaluation result satisfies the target. If the evaluation result is determined to satisfy the target (YES in step S220), then in step S222, the computer determines and outputs the values of the parameters determined in step S214 as final values. If the evaluation result is determined not to satisfy the target (NO in step S220), then in step S224, the computer modifies the values of at least one of the parameters of the main pattern and the auxiliary pattern. Having thus determined the values of the parameters again, the computer performs the processing in steps S216, S218, and S220 again.

The computer repeats the processing in steps S216, S218, S220, and S224 until the evaluation result of the image satisfies the target. In step S220, if the evaluation result is determined to satisfy the target (YES in step S220), then in step S222, the computer determines the values of the parameters determined in step S224 as the final values and generates mask data.

Next, description will be given in conjunction with specific examples. Description will be omitted in part, where common to the first exemplary embodiment. The preconditions are the same as in the first exemplary embodiment. The exposure light is an ArF excimer laser. The projection optical system has an NA of 1.35. An immersion exposure apparatus is assumed that performs exposure with a liquid filled between the projection optical system and a wafer. The mask is a binary mask. A positive resist is applied to the wafer.

Figure 12:
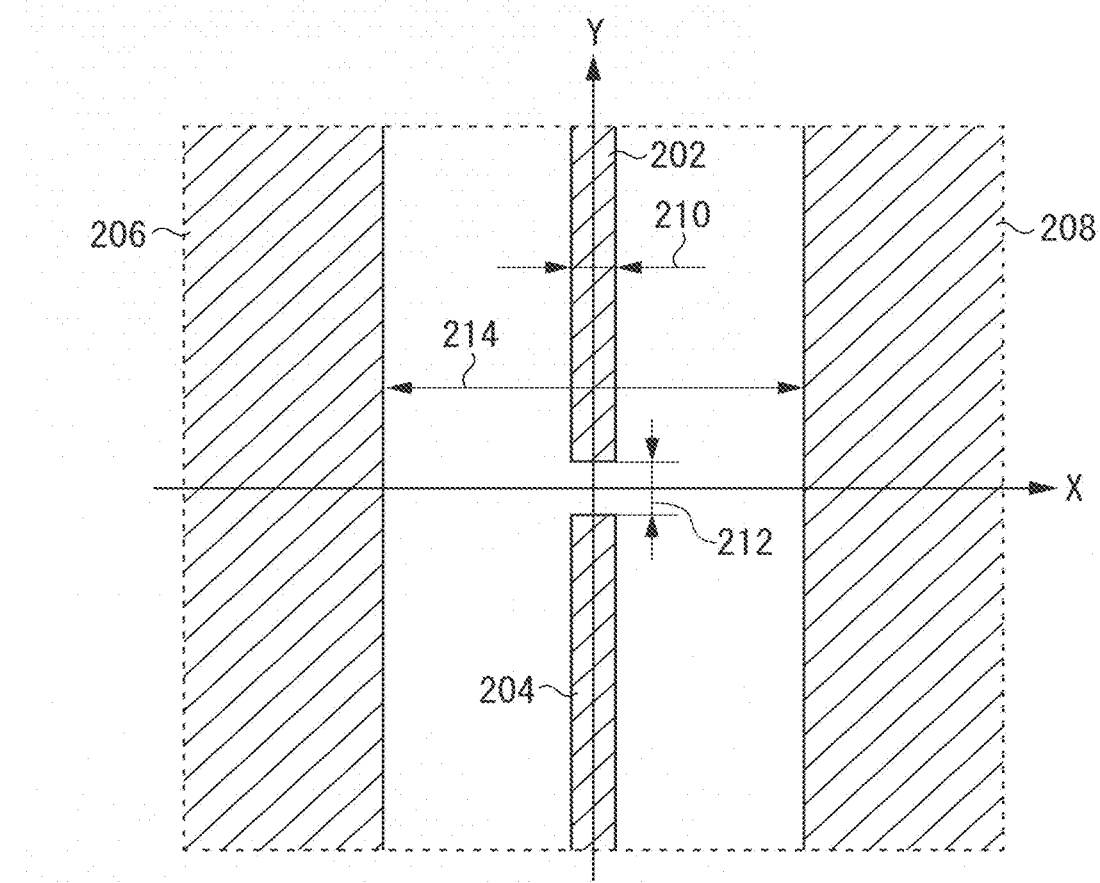
FIG. 12 illustrates a target pattern according to the second exemplary embodiment.
Figure 13:
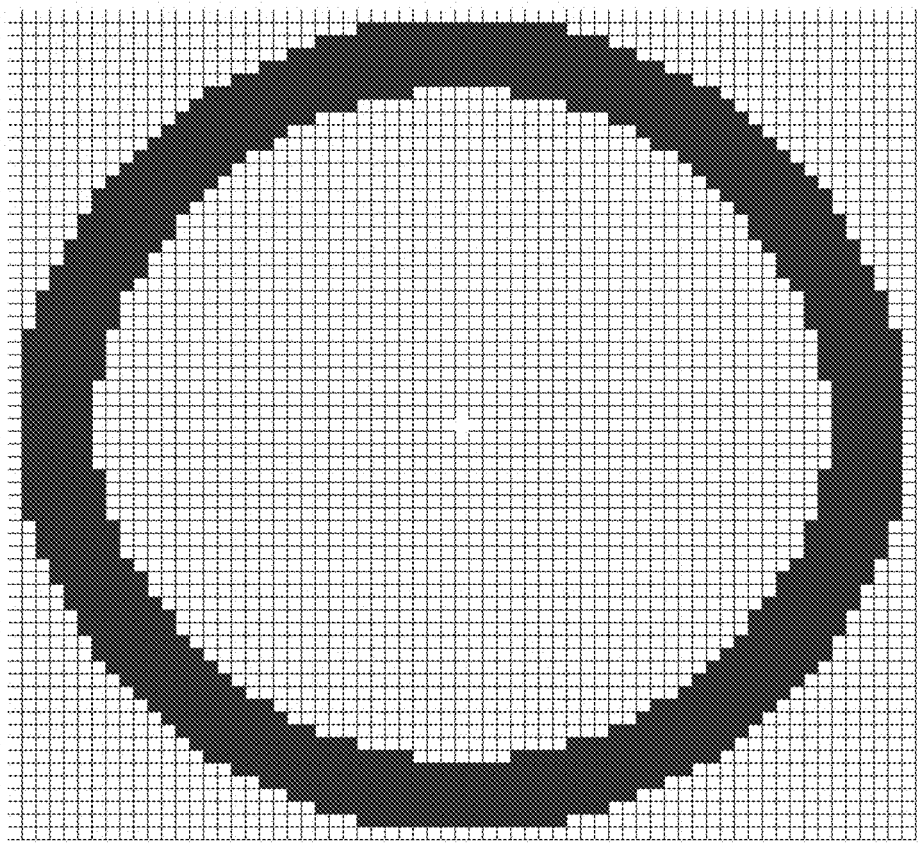
FIG. 13 illustrates an effective light source distribution according to the second exemplary embodiment.

FIG. 12 is an enlarged view of a center part of the shape of a target pattern to be formed on a wafer. The hatched portions represent areas not to be exposed. The white portions represent areas to be exposed. The target pattern is vertically and horizontally symmetrical. The axis of vertical symmetry will be referred to as an x-axis, and the axis of horizontal symmetry a y-axis. Line patterns 202 and 204 have a width 210 of 70 nm. A distance 212 between the line ends is 100 nm. The line patterns 202 and 204 have a sufficiently large length. Patterns 206 and 208 are large patterns arranged in the vicinity of the line patterns, with sufficiently large dimensions both in the horizontal and vertical directions. The large patterns 206 and 208 have an interval 214 of 550 nm therebetween. FIG. 13 illustrates an effective light source distribution that is set in advance. The set effective light source distribution is annular lighting of top hat shape with an outer $\sigma$ of 0.98 and an inner $\sigma$ of 0.80.

Figure 14:
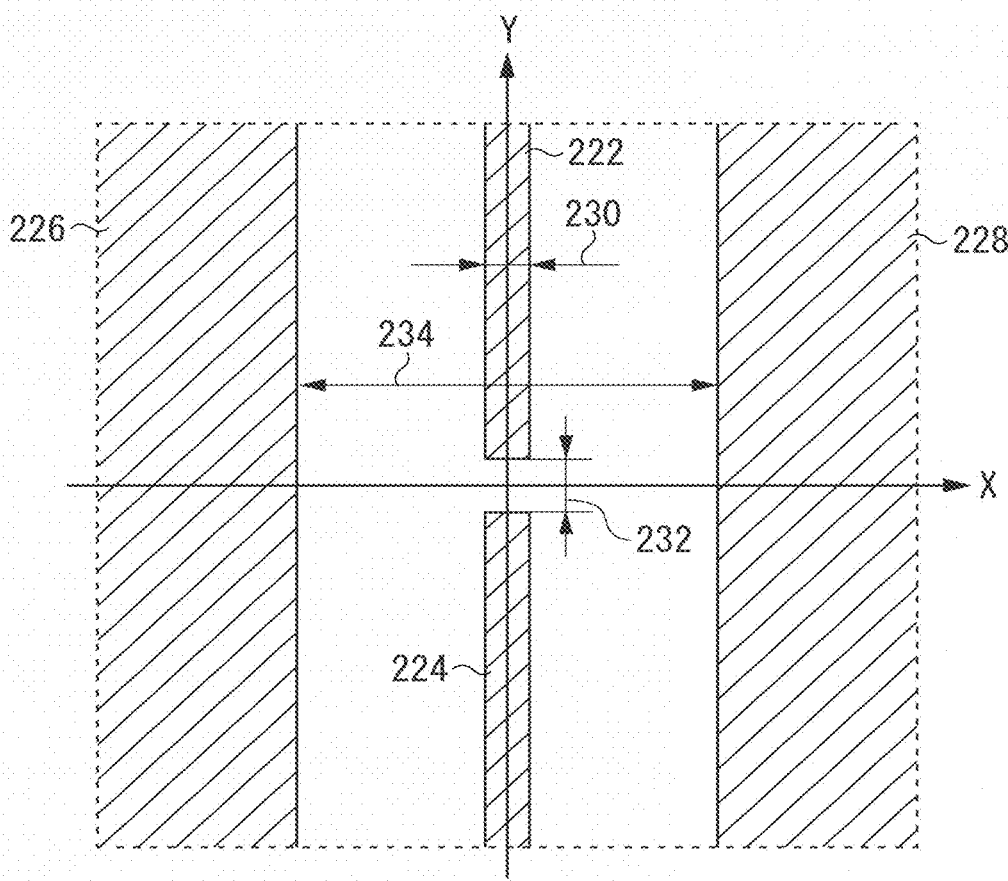
FIG. 14 illustrates the basic shape, basic layout, and parameters of a main pattern according to the second exemplary embodiment.

FIG. 14 illustrates the basic shape and basic layout of the main pattern and the parameters for determining the shape and position of the main pattern which are set in steps S202 and S204 of the flowchart in FIG. 11. The main pattern includes patterns 222, 224, 226, and 228. The main pattern has a basic shape of rectangular configuration with sides in parallel with the x- and y-axes. Since the target pattern is vertically and horizontally symmetrical and the effective light source distribution is symmetrical, the basic layout of the main pattern is also set to be vertically and horizontally symmetrical.

A parameter 230 indicates a line width of the line patterns 222 and 224 on the mask. A parameter 232 indicates an interval between the line patterns 222 and 224 on the mask. A parameter 234 indicates an interval between the large patterns 226 and 228. The shape and position of the main pattern are uniquely determined from the pattern symmetry described above if the values of these three parameters 230, 232, and 234 are determined. These three parameters 230, 232, and 234 are therefore set for the main pattern.

Figure 15:
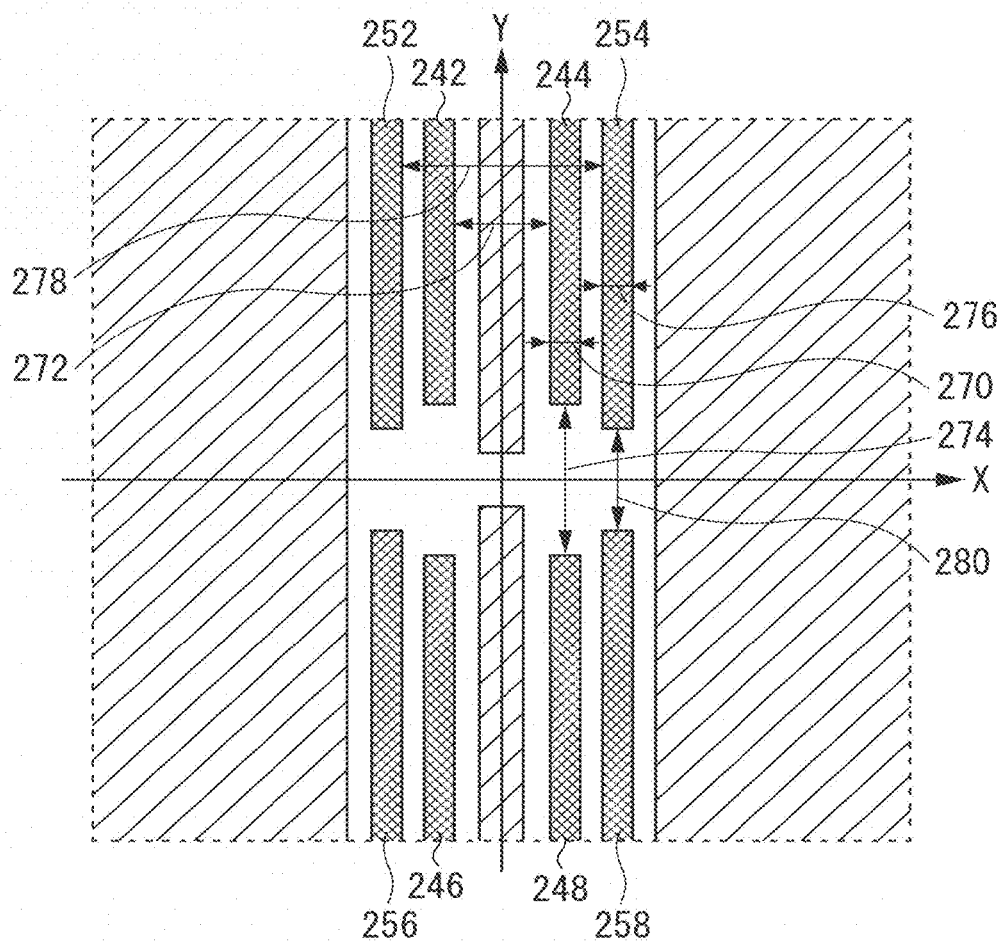
FIG. 15 illustrates the basic shape, basic layout, and parameters of an auxiliary pattern according to the second exemplary embodiment.

FIG. 15 illustrates the basic shape and basic layout of the auxiliary pattern and the parameters for determining the shape and position of the auxiliary pattern which are set in steps S206 and S208 of the flowchart. The auxiliary pattern includes patterns 242 to 258. The auxiliary pattern has a basic shape of rectangular configuration with sides in parallel with the x- and y-axes. Since the target pattern is vertically and horizontally symmetrical and the effective light source distribution is symmetrical, the basic layout of the auxiliary pattern is also set to be vertically and horizontally symmetrical.

A parameter 270 indicates a width of inner auxiliary patterns 242 to 248 on the mask. A parameter 272 indicates an interval of the inner auxiliary patterns 242 to 248 in the X direction. A parameter 274 indicates an interval of the inner auxiliary patterns 242 to 248 in the Y direction. The shape and position of the inner auxiliary patterns are uniquely determined from the pattern symmetry if the values of these three parameters 270, 272, and 274 are determined. Similarly, the shape and position of outer auxiliary patterns 252 to 258 are uniquely determined if the values of three parameters including a width 276, an interval 278 in the X direction, and an interval 280 in the Y direction are determined. In this way, the six parameters 270 to 280 are set for the auxiliary pattern.

Figure 16:
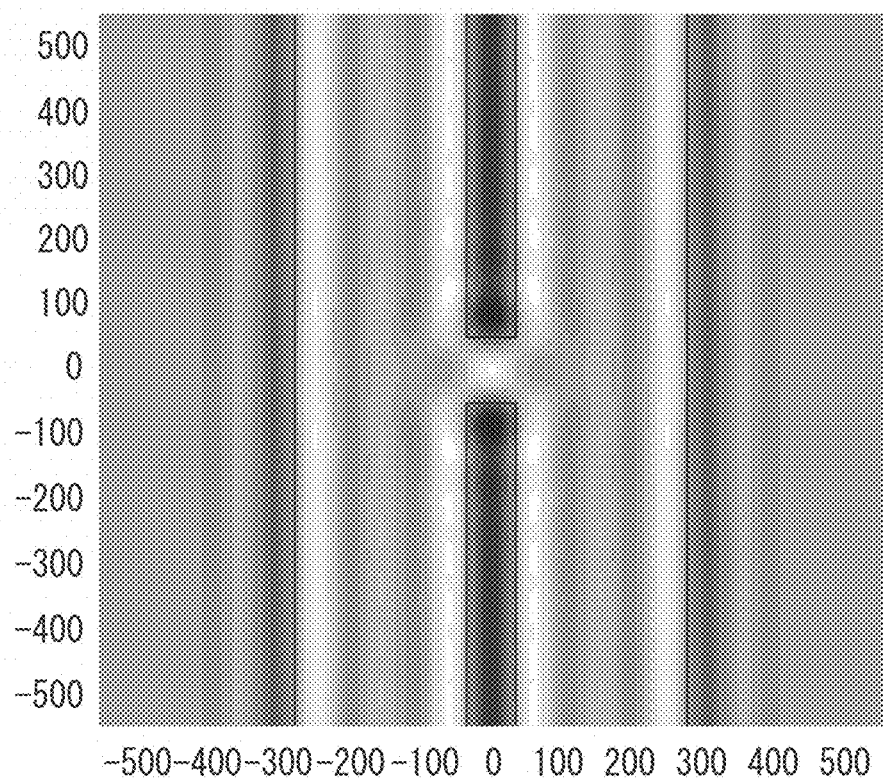
FIG. 16 illustrates a second-order differential of an approximate aerial image according to the second exemplary embodiment.

In the present exemplary embodiment, the basic shape and basic layout of the auxiliary pattern are determined by reference to Japanese Patent Application Laid-Open No. 2009-093138. FIG. 16 illustrates the second-order differential (Laplacian) of an approximate aerial image discussed in Japanese Patent Application Laid-Open No. 2009-093138, superposed on a target pattern (in solid lines). Relatively dim portions other than the portions of the target pattern are locations suited for an auxiliary pattern.

While the basic shape and basic layout of the auxiliary pattern in the present exemplary embodiment are determined by reference to the method discussed in Japanese Patent Application Laid-Open No. 2009-093138, the determination method is not limited thereto. For example, the basic shape and basic layout of the auxiliary pattern may be determined by reference to an interference map discussed in Robert Socha, et al., "Simultaneous Source Mask Optimization (SMO)," Proc. SPIE 5853, 180-193 (2005). The basic shape and basic layout of the auxiliary pattern may be determined by reference to a result of inverse lithography discussed in Daniel S. Abrams, et al., "Fast Inverse Lithography Technology," Proc. SPIE 6154, 61541J (2006).

Figure 17:
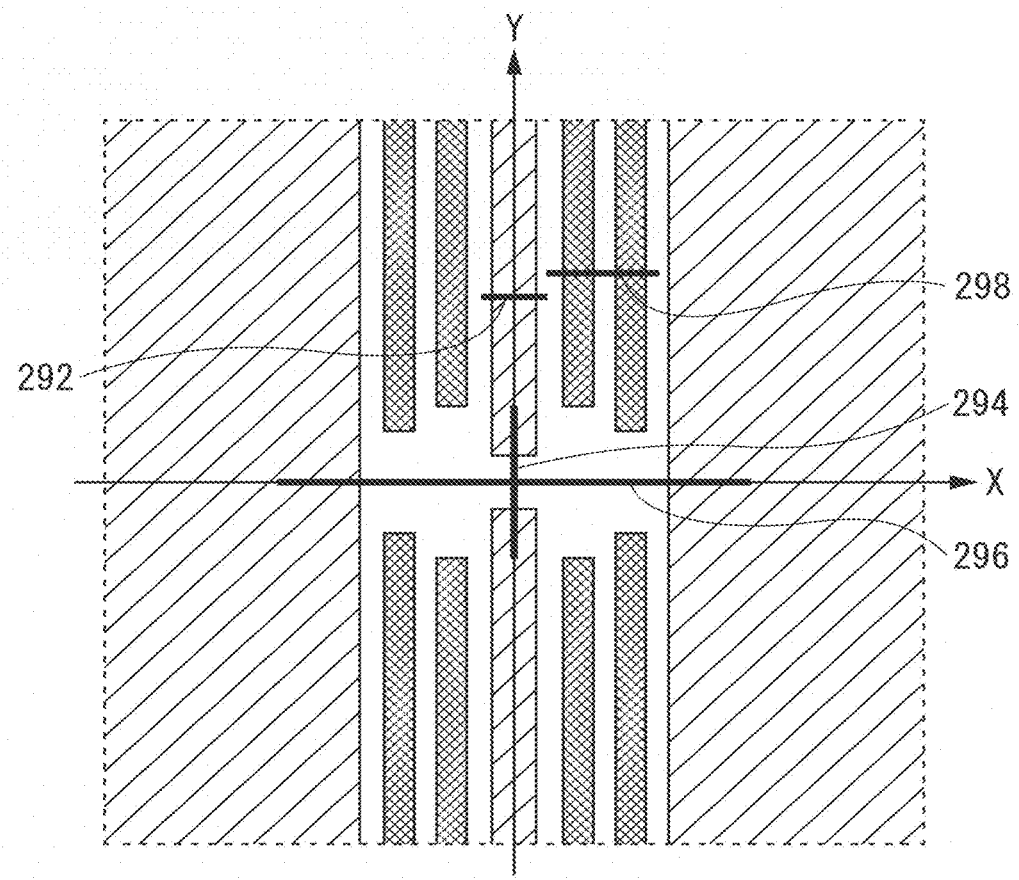
FIG. 17 illustrates a setting of evaluation positions according to the second exemplary embodiment.

FIG. 17 illustrates a setting of evaluation positions in step S212 of the flowchart in FIG. 11. Positions 292 to 298 in thick lines are where to evaluate the pattern image. An evaluation item in the position 292 is the width of the image of the line pattern. Another evaluation item in the position 292 is an ILS. In the position 294, the interval between the images of the line patterns in the Y direction is evaluated.

In the position 294, an image log slope (ILS) is also evaluated. In the position 296, the interval between the images of the large patterns is evaluated. The position 298 is located across the auxiliary patterns. Since the auxiliary pattern is not to be transferred to the substrate, the presence or absence of an image here is evaluated.

In the present exemplary embodiment, the shape of the target pattern, the shape of the pattern on the object plane, and the effective light source distribution are vertically and horizontally symmetrical. Further, the aberrations of the projection optical system are negligible, the formed image is also vertically and horizontally symmetrical. The evaluation positions are set in consideration of such symmetries. For ease of description, the evaluation positions in the present exemplary embodiment are reduced in number.

In step S214, the computer sets initial values of the parameters 230 to 234 and 270 to 280. The initial values may be set, for example, by setting upper and lower limits for each parameter and determining temporary values by random numbers. How to determine the temporary values of the parameters is concerned with optimization techniques, which are not a principle subject of the present invention. Detailed description thereof will thus be omitted.

Figure 18:
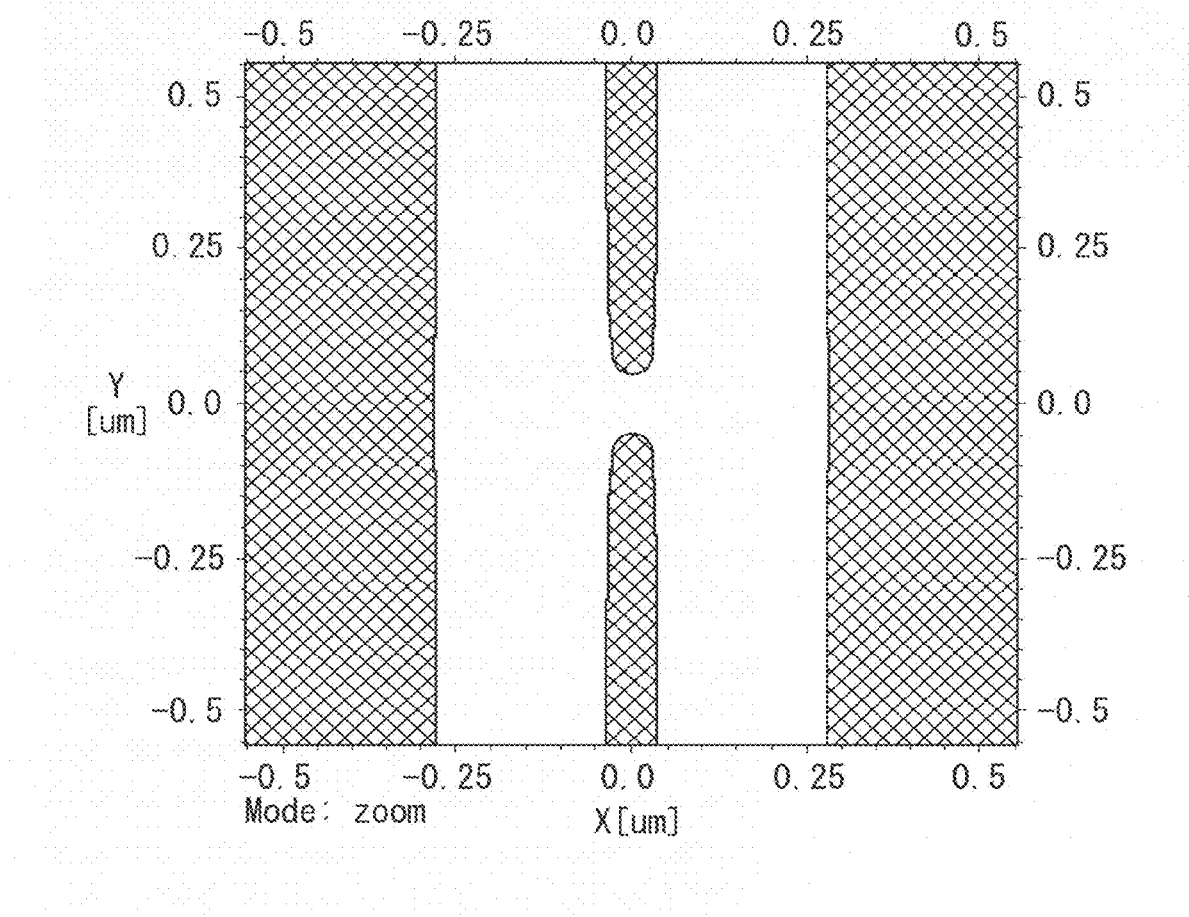
FIG. 18 illustrates an example of a pattern image according to the second exemplary embodiment.

In step S216, the computer acquires a pattern image. The computer calculates the pattern image by simulation, using the preconditions such as the wavelength, NA, and the effective light source distribution as well as the patterns that are determined by the parameter values set in step S214. FIG. 18 is a contour map illustrating an example of a pattern image. In the present exemplary embodiment, all the evaluation items set in step S212 are in a non-defocused state. The acquired image is thus a non-defocused image.

In step S218, the computer acquires an evaluation result. The computer evaluates the image acquired in step S216 for the evaluation items set in step S212 at the evaluation positions set in step S212.

In step S220, the computer determines whether the evaluation items satisfy the respective targets. The target employed in the present exemplary embodiment is such that the width 292 of the line pattern is as close to 70 nm as possible, the interval 294 between the line patterns in the Y direction is as close to 100 nm as possible, and the interval 296 between the large patterns is as close to 550 nm as possible. The target ILS values in the evaluation positions 292 and 294 are such that the smaller one of the ILS values in the evaluation positions 292 and 294 is as large as possible. The target in the evaluation position 298 is that there is no image formed. In the present exemplary embodiment, the target of "being as large as possible" makes the determination in step S220 always NO. To avoid this, in the present exemplary embodiment, the maximum number of times of determination is set in advance. The computer gives a YES if the maximum number of times is reached.

If NO in step S220, then in step S224, the computer modifies the values of at least one of the parameters of the main pattern and the auxiliary pattern to determine the values of the parameters again. How to determine the temporary values again is concerned with optimization techniques, which are not a principle subject of the present invention. Detailed description thereof will thus be omitted. Having determined the parameter values again, the computer repeats the processing in steps S216, S218, and S220. In such a repeat loop, the values of the parameters of both the main pattern and the auxiliary pattern are modified, and pattern image calculation and evaluation is performed.

If YES in S220, then in step S222, the computer determines those values of the respective parameters as the final values of the parameters. The computer outputs the final values of the parameters to a storage device or a display device as calculation results. In the present exemplary embodiment, it is determined YES in step S220 when the number of determinations reaches the maximum number of times. The computer then determines the parameters that correspond to a best evaluation result made so far, as the final values of the parameters.

Figure 19:
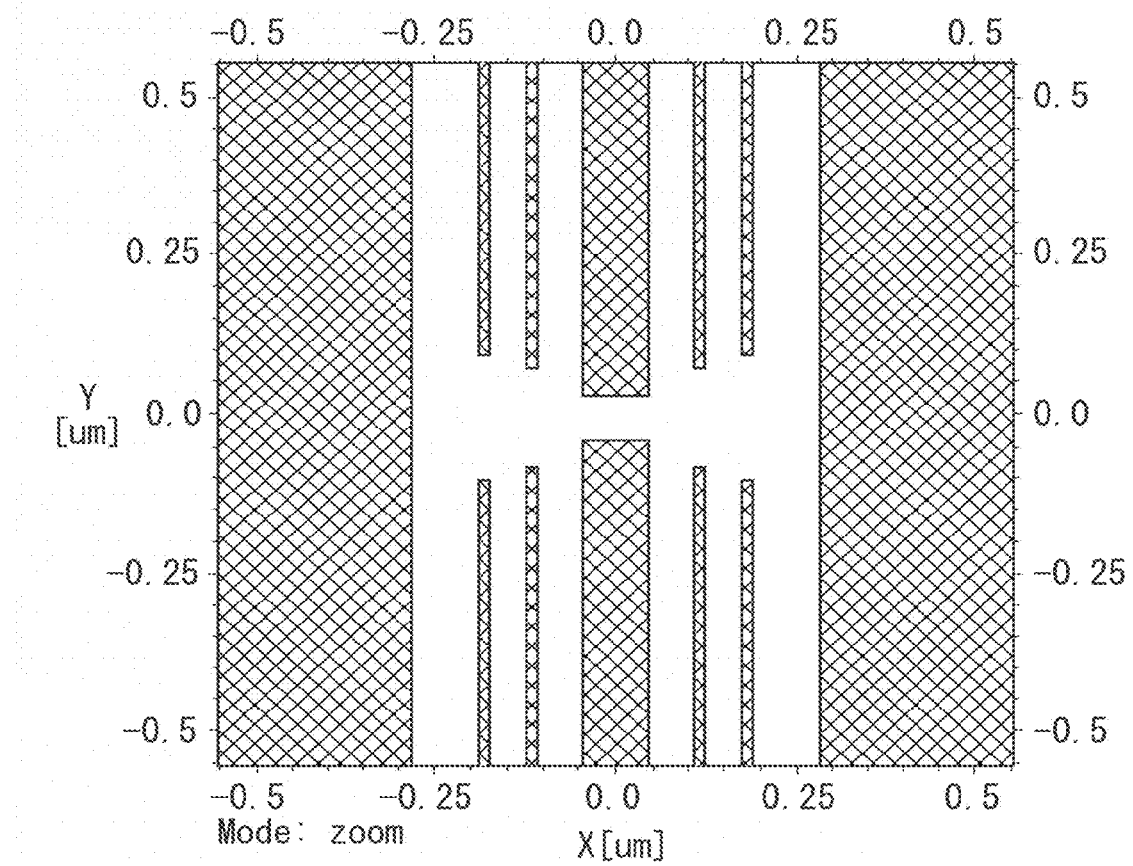
FIG. 19 illustrates a mask pattern that is determined in the second exemplary embodiment.

FIG. 19 illustrates a mask pattern that is determined by the final values of the parameters determined in step S222. Given the pattern image illustrated in FIG. 18, the evaluation result were as follows: The width 292 of the line pattern was 70.0 nm. The interval 294 between the line patterns in the Y direction wa 100.0 nm. The interval 296 between the large patterns was 550.0 nm. The results were thus sufficiently close to the targets. Further, no image of the auxiliary pattern was formed in the evaluation position 298. The ILS values in the evaluation positions 292 and 294 both were 26.1.

Figure 20:
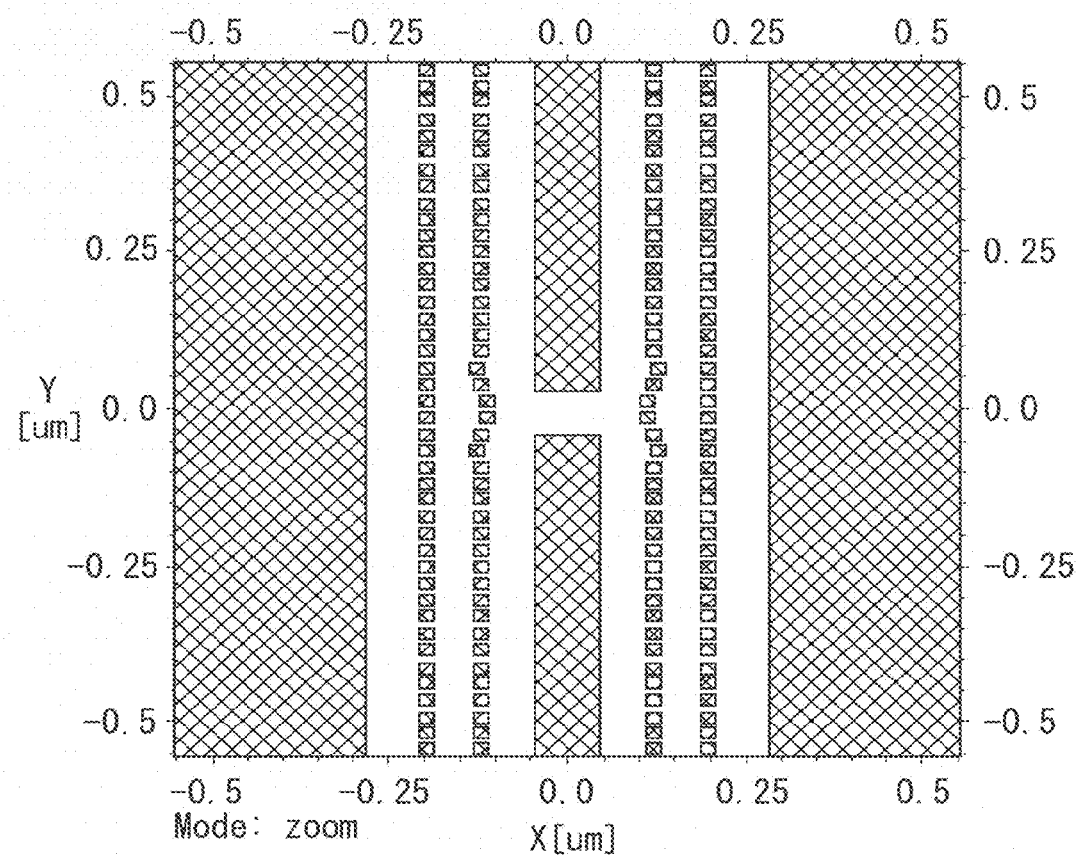
FIG. 20 illustrates a mask pattern according to a conventional technique.

For the sake of comparison, a result of the use of conventional technique will be described. This conventional example deals with a method for generating an auxiliary pattern by using the method discussed in Japanese Patent Application Laid-Open No. 2009-093138. FIG. 20 illustrates a mask pattern according to the conventional example. The evaluation results were as follows: The width 292 of the line pattern was 70.0 nm. The interval 294 between the line patterns in the Y direction was 100.0 nm. The interval 296 between the large patterns was 550.0 nm. The results were sufficiently close to the targets. Further, no image of the auxiliary pattern was formed in the evaluation position 298. The ILS values in the evaluation positions 292 and 294 were 26.1 and 25.0, respectively. As compared to the present exemplary embodiment, the width portion 292 of the line pattern has the same ILS value. The present exemplary embodiment is superior in terms of the ILS value in the interval portion 294 between the two line patterns. The auxiliary pattern illustrated in FIG. 20 is complicated one, including a plurality of rectangles. In contrast, the mask pattern according to the present exemplary embodiment illustrated in FIG. 19 is simple.

As described above, according to the present exemplary embodiment, the image performance of the pattern including the main pattern and the auxiliary pattern is evaluated while modifying the values of the parameters of the main pattern and the auxiliary pattern. Accordingly, the present exemplary embodiment can generate a mask pattern having a high resolution performance, which can provide an image highly similar to a target pattern. Further, according to the present exemplary embodiment, the fewer mask parameters make the mask pattern simpler, which can suppress the mask manufacturing cost as compared to conventional techniques.

A suitable example of application of the present exemplary embodiment is the creation of a design manual. In circuit design of an integrated circuit, the exposure condition is often optimized to a finest pattern. Other patterns to be simultaneously exposed with the finest pattern then have a sufficient exposure margin under the exposure condition. There are some relatively-coarse patterns, however, that may fail to provide a sufficient exposure margin unless under a proper exposure condition. Such patterns are not available for circuit design. For example, line-and-space patterns have a sufficient exposure margin at a certain pitch but may fail to provide a sufficient exposure margin in some pitch range where the pitch is even greater. Such a pitch range is sometimes referred to as a forbidden pitch. A design manual is a pre-examined list of patterns that are available for circuit designs and patterns that are not.

In all or part of a design manual, the exposure condition is fixed, which corresponds to the situation of the second exemplary embodiment. The method according to the second exemplary embodiment may thus be used for the creation of a design manual. Inverse lithography according to the conventional technique also seems to be available to generate a design manual. However, in the conventional technique, since a mask pattern in question is surrounded by different mask patterns when creating a design manual and when finally generating a mask, the final mask pattern can be greatly different from the mask pattern that is generated at the time of creation of the design manual. This gives rise to an issue that the final mask pattern for use in device manufacturing fails to provide desired image performance. In contrast, the method according to the second exemplary embodiment has no such issue since the shape and the position of the pattern on the mask can be controlled both when setting the parameters of the patterns on the mask in step S204 and S208 and when determining the values of the parameters in step S214.

Another suitable example of application of the present exemplary embodiment of the present invention is application to a standard cell library. A standard cell library is sometimes created under a fixed exposure condition due to some restrictions. Such a situation corresponds to the second exemplary embodiment. The method according to the second exemplary embodiment may thus be used for the creation of a standard cell library. Inverse lithography according to the conventional technique also seems to be available to create a standard cell library. However, in the conventional technique, since a mask pattern in question is surrounded by different mask patterns when creating a standard cell library and when finally generating a mask, the final mask pattern can be greatly different from the mask pattern that is generated at the time of creation of the library. This gives rise to an issue that the final mask pattern for use in device manufacturing fails to provide desired image performance. In contrast, the method according to the second exemplary embodiment has no such issue since the shape and the position of the mask pattern can be controlled both when setting the parameters of the patterns on the mask in step S204 and S208 and when determining the values of the parameters in step S214.

The mask data including the values of the parameters of the mask pattern determined in the above described exemplary embodiments is input to a mask manufacturing apparatus (drawing apparatus). The mask manufacturing apparatus draws a pattern to manufacture a mask based on the input data. The exposure condition determined in the first exemplary embodiment or the predetermined exposure condition in the second exemplary embodiment is then set to an exposure apparatus. The exposure apparatus illuminates the manufactured mask to project the image of the mask pattern onto a photo-sensitive agent (resist) on a wafer, thereby exposing the photo-sensitive agent.

Next, a method of manufacturing a device (semiconductor device, liquid crystal display device, etc.) as an embodiment of the present invention is described.

The semiconductor device is manufactured through a front-end process in which an integrated circuit is formed on a substrate such as a wafer, and a back-end process in which a product such as an integrated circuit chip is completed from the integrated circuit on the wafer formed in the front-end process. The front-end process includes a step of exposing the substrate coated with a photoresist to light using the above-described exposure apparatus of the present invention, and a step of developing the exposed substrate. The back-end process includes an assembly step (dicing and bonding), and a packaging step (sealing).

The liquid crystal display device is manufactured through a process in which a transparent electrode is formed. The process of forming a plurality of transparent electrodes includes a step of coating a substrate such as a glass substrate with a transparent conductive film deposited thereon with a photoresist, a step of exposing the substrate coated with the photoresist thereon to light using the above-described exposure apparatus, and a step of developing the exposed glass substrate.

The device manufacturing method of this embodiment has an advantage, as compared with a conventional device manufacturing method, in at least one of performance, quality, productivity and production cost of a device.

Aspects of the present invention can also be realized by a computer of a system or apparatus (or devices such as a CPU or MPU) that reads out and executes a program recorded on a memory device to perform the functions of the above-described embodiment (s), and by a method, the steps of which are performed by a computer of a system or apparatus by, for example, reading out and executing a program recorded on a memory device to perform the functions of the above-described embodiment (s). For this purpose, the program is provided to the computer for example via a network or from a recording medium of various types serving as the memory device (e.g., computer-readable medium).

While the present invention has been described with reference to exemplary embodiments, it is to be understood that the invention is not limited to the disclosed exemplary embodiments. The scope of the following claims is to be accorded the broadest interpretation so as to encompass all modifications, equivalent structures, and functions.

This application claims priority from Japanese Patent Application No. 2010-244368 filed Oct. 29, 2010, which is hereby incorporated by reference herein in its entirety.

What is claimed is:

1. A non-transitory recording medium storing a program for causing a computer to determine data of a mask and an exposure condition used in an exposure apparatus that exposes a substrate using a projection optical system for projecting an image of a pattern of the mask onto the substrate, wherein
the mask includes a main pattern for resolving a target pattern to be formed on the substrate and an auxiliary pattern for assisting the main pattern to resolve, and
the program causes the computer to execute steps of:
setting a main value of a parameter of the main pattern and an auxiliary value of a parameter of the auxiliary pattern;
setting a light intensity value of a parameter of a light intensity distribution on a pupil plane of an illumination optical system for illuminating the mask;
calculating an image of the main pattern that is formed if the main pattern and the auxiliary pattern determined by the main and auxiliary values respectively, are projected by using the projection optical system under the light intensity distribution determined by the light intensity value;
evaluating the calculated image of the main pattern;
changing the main value, the auxiliary value and the light intensity value based on an evaluation result of the calculated image of the main pattern;
repeating the step of calculating the image of the main pattern using the changed main value, the changed auxiliary value and the changed light intensity value the step of evaluating the calculated image of the main pattern, and the step of changing the main value, the auxiliary value and the light intensity value based on an evaluation result of the calculated image of the main pattern; and
determining the main pattern, the auxiliary pattern, and the light intensity distribution based on the evaluation results of repeating the step.

2. The non-transitory recording medium according to claim 1, wherein one feature of the main pattern has a combination of plural polygonal shapes, and the parameter of the main pattern has parameters of the plural polygonal shapes.

3. The non-transitory recording medium according to claim 1, wherein one feature of the auxiliary pattern has a combination of plural polygonal shapes, and the parameter of the auxiliary pattern has parameters of the plural polygonal shapes.

4. A method for manufacturing a mask, the method comprising:
generating data of a mask by causing a computer to execute a program stored on a recording medium according to claim 1; and
manufacturing a mask with use of the generated data of the mask.

5. An exposure method comprising:
manufacturing a mask by a method for manufacturing a mask according to claim 4; and
projecting an image of a pattern of the manufactured mask onto a substrate to expose the substrate.

6. The non-transitory recording medium according to claim 1, wherein the program causes the computer to execute steps of:
determining whether the evaluation result satisfies a target;
performing calculation of the image of the main pattern, if the evaluation result does not satisfy the target, by modifying the main value, the auxiliary value and the light intensity value; and
determining the main pattern, the auxiliary pattern and the light intensity distribution determined by the main value, the auxiliary value and the light intensity value which are set at that time if the evaluation result satisfies the target.

7. A method for determining data of a mask and an exposure condition used in an exposure apparatus that exposes a substrate using a projection optical system for projecting an image of a pattern of the mask onto the substrate, wherein
the mask includes a main pattern for resolving a target pattern to be formed on the substrate and an auxiliary pattern for assisting the main pattern to resolve, and
the method comprising the following steps executed by a processor:
setting a main value of a parameter of the main pattern and an auxiliary value of a parameter of the auxiliary pattern;
setting a light intensity value of a parameter of a light intensity distribution on a pupil plane of an illumination optical system for illuminating the mask;
calculating an image of the main pattern that is formed if the main pattern and the auxiliary pattern determined by the main and auxiliary values respectively, are projected by using the projection optical system under the light intensity distribution determined by the light intensity value;
evaluating the calculated image of the main pattern changing the main value, the auxiliary value and the light intensity value based on an evaluation result of the calculated image of the main pattern;
repeating a step of changing the main value, the auxiliary value and the light intensity value based on an evaluation result of the calculated image, the step of calculating the image of the main pattern using the changed main value, the changed auxiliary value and the changed light intensity value the step of evaluating the calculated image of the main pattern, and the step of changing the main value, the auxiliary value and the light intensity value based on an evaluation result of the calculated image of the main pattern; and
determining the main pattern, the auxiliary pattern and the light intensity distribution based on the evaluation results of repeating the steps.

* * * * *